United States Patent
Yokoyama et al.

(10) Patent No.: US 8,120,242 B2
(45) Date of Patent: Feb. 21, 2012

(54) TRANSISTOR AND PROCESS OF PRODUCING THE SAME, LIGHT-EMITTING DEVICE, AND DISPLAY

(75) Inventors: Masaaki Yokoyama, Toyonaka (JP); Kenichi Nakayama, Yonezawa (JP)

(73) Assignees: Osaka University, Osaka-Fu (JP); Sumitomo Chemical Company, Ltd., Tokyo-To (JP); Dai Nippon Printing Co., Ltd., Shinjuku-Ku (JP); Ricoh Company, Ltd., Tokyo-To (JP)

( * ) Notice: Subject to any disclaimer, the term of this patent is extended or adjusted under 35 U.S.C. 154(b) by 436 days.

(21) Appl. No.: 12/293,649

(22) PCT Filed: Mar. 22, 2007

(86) PCT No.: PCT/JP2007/055891
§ 371 (c)(1), (2), (4) Date: Sep. 19, 2008

(87) PCT Pub. No.: WO2007/119490
PCT Pub. Date: Oct. 25, 2007

(65) Prior Publication Data
US 2009/0108749 A1   Apr. 30, 2009

(30) Foreign Application Priority Data
Mar. 22, 2006   (JP) ................ 2006-078237

(51) Int. Cl.
*H01L 51/52* (2006.01)
(52) U.S. Cl. ........................... 313/504; 438/365
(58) Field of Classification Search .............. 438/365; 257/321–322, 518, 40, 565; 313/504
See application file for complete search history.

(56) References Cited

U.S. PATENT DOCUMENTS

| | | | |
|---|---|---|---|
| 4,127,861 A | 11/1978 | Deneuville | |
| 5,315,129 A | 5/1994 | Forrest et al. | |
| 2003/0085397 A1* | 5/2003 | Geens et al. | 257/40 |

FOREIGN PATENT DOCUMENTS

| | | | |
|---|---|---|---|
| EP | 0 156 647 A1 | 10/1985 | |
| EP | 1 221 719 A2 | 7/2002 | |
| JP | 54-051782 A1 | 4/1979 | |
| JP | 60-206073 A1 | 10/1985 | |

(Continued)

OTHER PUBLICATIONS

Shin-ya Fujimoto et al., "*Fabrication of a Vertical-Type Organic Transistor with a Planar Metal Base*," Applied Physics Letters, vol. 87, No. 13, Sep. 26, 2005, pp. 133503-1 to 133503-3.

(Continued)

*Primary Examiner* — Nimeshkumar Patel
*Assistant Examiner* — Mary Ellen Bowman
(74) *Attorney, Agent, or Firm* — Burr & Brown

(57) ABSTRACT

A transistor capable of modulating, at low voltages, a large current flowing between an emitter electrode and a collector electrode. A process of producing the transistor, a light-emitting device comprising the transistor, and a display comprising the transistor. The transistor comprises an emitter electrode and a collector electrode. Between the emitter electrode and the collector electrode are situated a semiconductor layer and a sheet base electrode. It is preferred that the semiconductor layer be situated between the emitter electrode and the base electrode and also between the collector electrode and the base electrode to constitute a second semiconductor layer and a first semiconductor layer, respectively. It is also preferred that the thickness of the base electrode be 80 nm or less. Furthermore, a dark current suppressor layer is situated at least between the emitter electrode and the base electrode, or between the collector electrode and the base electrode.

12 Claims, 11 Drawing Sheets

FOREIGN PATENT DOCUMENTS

JP  61-093663 A1    5/1986
JP  03295242 A  *  12/1991

OTHER PUBLICATIONS

Koichi Kudo, "*Yuki Toranjitsuta no Genjo to Shorai Tenbo* (*The Present State and Future Prospects of Transistors*)," Oyo Butsuri (Applied Physics), vol. 72, No. 9, Sep. 10, 2003, pp. 1151-1156.

Ken ichi Nakayama et al., "*Charge-Injection-Controlled Organic Transistor*," Applied Physics Letters, vol. 82, No. 25, Jun. 23, 2003, pp. 4584-4586.

Serkan Zorba et al., "*Feasibility of Static Induction Transistor with Organic Semiconductors*," Applied Physics Letters, vol. 86, No. 19, May 5, 2005, pp. 193508-1.

* cited by examiner

TRANSISTOR AND PROCESS OF PRODUCING THE SAME, LIGHT-EMITTING DEVICE, AND DISPLAY

BACKGROUND OF THE INVENTION

1. Field of the Invention

The present invention relates to a transistor, a process of producing it, to a light-emitting device, and to a display. More particularly, the present invention relates to a transistor capable of modulating, at low voltages, a large current flowing between the emitter and the collector, to a process of producing the transistor, to a light-emitting device comprising the transistor, and to a display comprising the transistor.

2. Background Art

Although some displays using organic transistors, produced on an experimental basis, have been reported in recent years, many of them are combinations of organic field-effect transistors (organic FETs) and liquid crystals or electrophoretic cells, and there have been reported few displays using organic EL devices. This is because it is not easy for the present organic FETs to allow currents large enough to switch organic EL devices, current-driven devices, to flow. There is therefore a demand for development of organic FETs that operate at lower voltages and with larger currents.

In order to fulfill the above demand, it is necessary to decrease the channel length, when the mobility of the known organic materials are taken into account. However, with patterning techniques useful for the mass production of displays, it is difficult to decrease the channel length to below several micrometers. In order to solve this problem, studies have been made on "vertical transistor structures", in which currents flow along the film thickness to make the transistors operable at lower voltages and with larger currents. Generally, the thickness of a sandwich transistor is several tens nanometers, and, moreover, it can be controlled with high accuracy of several angstroms. It is therefore easy to attain a shorter channel with a length of 1 μm or less by forming the channel along the film thickness. Polymer grid triode structures, static induction transistors (SITs), etc. have been proposed as such vertical organic transistors.

Recently, there has been proposed an organic transistor excellent in transistor performance that can be produced only by making a simple semiconductor/metal/semiconductor layered structure (see non-Patent Document 1). In such an organic transistor, electrons injected from the emitter electrode pass through the intermediate metal electrode to cause current amplification comparable to that with bipolar transistors. Since the intermediate metal electrode works like the base electrode, this organic transistor is called the metal-base organic transistor (MBOT). However, the semiconductor/metal/semiconductor layered structure has not always provided the above transistor action.

Non-Patent Document 1: S. Fujimoto, K. Nakayama and M. Yokoyama, Appl. Phys. Lett., 87, 133503 (2005).

SUMMARY OF THE INVENTION

An object of the present invention is to provide a transistor that can modulate, at low voltages, a large current flowing between the emitter electrode and the collector electrode. The other objects of the present invention are to provide a process of producing such a transistor, and also to provide a light-emitting device comprising the transistor and a display comprising the transistor.

(First Transistor)

A first transistor of the present invention comprises an emitter electrode, a collector electrode, and a semiconductor layer and a sheet base electrode between the emitter electrode and the collector electrode.

In the first transistor of the present invention, the semiconductor layer is composed of a first semiconductor layer situated between the collector electrode and the base electrode, and a second semiconductor layer situated between the emitter electrode and the base electrode.

According to this invention, the semiconductor layer is situated between the emitter electrode and the collector electrode, and the sheet base electrode is situated within the semiconductor layer, so that when a collector voltage is applied to between the emitter electrode and the collector electrode and a base voltage is applied to between the emitter electrode and the base electrode, charges (electrons or holes) injected from the emitter electrode are significantly accelerated and pass through the base electrode due to the base voltage applied and arrive at the collector electrode. Namely, by applying a base voltage, it is possible to amplify the current flowing between the emitter electrode and the collector electrode. Furthermore, according to this invention, the sheet base electrode is formed on the entire surface of the semiconductor layer to such a thickness that the base electrode accelerates, due to the base voltage, the charges supplied from the emitter electrode to make them into ballistic electrons or holes, and that the ballistic electrons or holes can easily pass through the base electrode and enter into the semiconductor layer situated on the collector electrode side, so that the charges are significantly accelerated on the entire surface of the sheet base electrode and that the accelerated charges can easily pass through the base electrode. On the other hand, we found the following in the course of our studies. When the base electrode is not in sheet form (i.e., when the base electrode has discontinuities such as holes or cracks), the charges injected from the emitter electrode are not so accelerated at the discontinuities, and the charges not so accelerated cannot easily pass through the base electrode. Consequently, the current flowing between the emitter electrode and the collector electrode cannot be amplified so much, as a whole, and, moreover, the increase of the current varies depending on position. Therefore, according to the transistor of the present invention, there can be stably obtained current amplification effects comparative to those of bipolar transistors.

In the first transistor of the present invention, the base electrode has a thickness of 80 nm or less.

According to this invention, since the thickness of the base electrode is 80 nm or less, the ballistic electrons or holes accelerated due to the base voltage Vb can easily pass through the base electrode. As a result, the charges are significantly accelerated on the entire surface of the sheet base electrode, and, moreover, the accelerated charges can easily pass through the base electrode. Since the base electrode can fulfil its purpose as long as it is situated within the semiconductor layer as a continuous film (without discontinuities such as holes or cracks), the thickness of the base electrode has no particular lower limit, and a thickness of about 1 nm is usually enough.

In the first transistor of the present invention, the base electrode has irregularities on its surfaces.

The base electrode having irregularities on its surface (in other words, the base electrode having high surface roughness) has thick and thin portions even when it has been formed so that it has a specified mean thickness. According to the present invention, when the base electrode has irregularities on its surface, current amplification effects can be obtained stably.

In the first transistor of the present invention, the semiconductor layer situated between the collector electrode and the base electrode is a crystalline semiconductor layer.

Since the crystalline semiconductor layer situated between the collector electrode and the base electrode has irregularities on its surface (in other words, the crystalline semiconductor layer has high surface roughness), the base electrode formed on it also has irregularities. The base electrode having irregularities has thick and thin portions even when it has been formed so that it has a specified mean thickness. According to the present invention, when the base electrode has irregularities, current amplification effects can be obtained stably.

In the first transistor of the present invention, the crystals making up the semiconductor layer have diameters that are nearly equal to or greater than the thickness of the base electrode and that are great enough to cause irregularities on the surface of the base electrode.

According to this invention, since the diameters of the crystals making up the crystalline semiconductor layer are nearly equal to or greater than the thickness of the base electrode and are great enough to cause irregularities on the surface of the base electrode, the base electrode formed on the semiconductor layer can easily have irregularities.

In the first transistor of the present invention, the base electrode is a film of a metal, and its one or each surface is covered with a film of an oxide of the metal.

In the first transistor of the present invention, the first semiconductor layer situated between the collector electrode and the base electrode and the second semiconductor layer situated between the emitter electrode and the base electrode are layers of different semiconductor materials.

In the first transistor of the present invention, the first semiconductor layer and the second semiconductor layer are hole or electron transporting material layers.

In the first transistor of the present invention, the first semiconductor layer situated between the collector electrode and the base electrode and the second semiconductor layer situated between the emitter electrode and the base electrode are organic compound layers.

In the first transistor of the present invention, the thickness T1 of the first semiconductor layer situated between the collector electrode and the base electrode and the thickness T2 of the second semiconductor layer situated between the emitter electrode and the base electrode are in a ratio (T1/T2) ranging from 1/1 to 10/1.

The first transistor of the present invention further comprises a charge injection layer between the emitter electrode and the semiconductor layer adjacent to the emitter electrode.

In the first transistor of the present invention, the charge injection layer includes an alkaline metal, such as LiF or Ca, or a compound thereof.

(Second Transistor)

A second transistor of the present invention comprises an emitter electrode, a collector electrode, a semiconductor layer and a sheet base electrode between the emitter electrode and the collector electrode, and a dark current suppressor layer at least between the emitter electrode and the base electrode, or between the collector electrode and the base electrode.

The second transistor is for solving the problem that when a voltage Vc of e.g., 5 V is applied to the area between the emitter electrode and the collector electrode in the aforementioned first transistor, leakage current, other than the current component needed to operate the transistor, sometimes flows between the base electrode and the collector electrode when a low or no voltage Vb is applied to the area between the emitter electrode and the base electrode, which leads to decrease in ON/OFF ratio. An object of the second transistor is to provide a transistor comprising a thin sheet base electrode in a semiconductor layer, having an ON/OFF ratio improved by suppressing the flow of leakage current not necessary for its operation.

According to this invention, since the dark current suppressor layer is situated at least between the emitter electrode and the base electrode, or between the collector electrode and the base electrode, it is possible to prevent effectively leakage current (called the "dark current" (the current that flows when the switch is off)), other than the current component needed to operate the transistor, from flowing between the base electrode and the collector electrode when a low or no voltage Vb is applied to the area between the emitter electrode and the base electrode. Consequently, an increased ON/OFF ratio is obtained. For example, the dark current suppressor layer functions in such a way that it effectively suppresses the flow of dark current when no voltage Vb is applied to the area between the emitter electrode and the base electrode, but that it does not so suppress the flow of so-called ON-state current when a voltage Vb is applied to the area between the emitter electrode and the base electrode.

In the second transistor of the present invention, the dark current suppressor layer is situated between the collector electrode and the base electrode.

In the second transistor of the present invention, the dark current suppressor layer and the base electrode are adjacent to each other.

According to the above invention, since the dark current suppressor layer is situated between the collector electrode and the base electrode, the flow of dark current can be effectively suppressed. Consequently, an increased ON/OFF ratio can be obtained.

In the second transistor of the present invention, the dark current suppressor layer is an organic or inorganic insulating material layer.

In the second transistor of the present invention, the dark current suppressor layer is a layer of an organic or inorganic semiconductor material layer.

In the second transistor of the present invention, the dark current suppressor layer includes silicon oxide or aluminum oxide film.

In the second transistor of the present invention, the dark current suppressor layer is formed by the chemical reaction of the base electrode.

In the second transistor of the present invention, the dark current suppressor layer has a thickness of 20 nm or less.

In the second transistor of the present invention, the semiconductor layer situated between the emitter electrode and the base electrode, or between the collector electrode and the base electrode, is an organic compound layer.

(Process of Producing Transistor)

A process of the present invention, for producing a transistor, is a process of producing a transistor comprising an emitter electrode, a collector electrode, and a semiconductor layer and a sheet base electrode between the emitter electrode and the collector electrode, and it comprises the steps of forming the base electrode, and forming a dark current suppressor layer at least between the emitter electrode and the base electrode, or between the collector electrode and the base electrode, by causing the base electrode to react chemically.

In the process of the present invention, for producing a transistor, the dark current suppressor layer is formed by partially oxidizing the base electrode, after forming the base electrode.

In the process of the present invention, for producing a transistor, the dark current suppressor layer is formed by thermally treating the base electrode, after forming the base electrode.

According to the above invention, the dark current suppressor layer can be formed easily, and it is easy to provide a transistor having an ON/OFF ratio increased by suppressing the flow of leakage current.

(Electronic Device)

An electronic device of the present invention comprises a transistor as a switching element, the transistor comprising an emitter electrode, a collector electrode, and a semiconductor layer and a sheet base electrode between the emitter electrode and the collector electrode.

Another electronic device of the present invention comprises a transistor as a switching element, the transistor comprising an emitter electrode, a collector electrode, a semiconductor layer and a sheet base electrode between the emitter electrode and the collector electrode, and a dark current suppressor layer at least between the emitter electrode and the base electrode, or between the collector electrode and the base electrode.

The present invention can provide an electronic device that is a combination of the first or second transistor of the invention and e.g., an organic EL device, where the transistor serves as a switching element for the organic EL device.

According to the above invention, since the first or second transistor can attain large current modulation at low voltages, it can provide, when combined with e.g., an organic EL device, an electronic device in which the first or second transistor serves as a driving transistor, a switching element, for the organic EL device.

(Light-Emitting Device)

A first light-emitting device of the present invention comprises an emitter electrode, a collector electrode, a semiconductor layer and a sheet base electrode between the emitter electrode and the collector electrode, and an organic EL layer between the base electrode and the collector electrode, the organic EL layer including at least one luminescent layer.

A second light-emitting device of the present invention comprises an emitter electrode, a collector electrode, a semiconductor layer and a sheet base electrode between the emitter electrode and the collector electrode, a dark current suppressor layer at least between the emitter electrode and the base electrode, or between the collector electrode and the base electrode, and an organic EL layer between the base electrode and the collector electrode, the organic EL layer including at least one luminescent layer.

In recent years, organic light-emitting transistors using vertical organic SITs have been known to have practical performance (Koichi KUDO; *Yuki Toranjisuta no Genjo to Shorai Tenbo* (or The Present State and Future Prospects of Transistors), *Oyo Butsuri* (or Applied Physics), Vol. 74 (9), p.p. 1151-1156 (2003)). However, their performance is not yet satisfactory, and they require further improvements. The light-emitting device of the present invention comprises an organic EL layer between the base electrode and the collector electrode, and the organic EL layer comprises at least one luminescent layer, so that the light-emitting device can achieve surface light emission with a large current. In the production of the light-emitting device of the invention, a micro-patterning process is not necessary to make the base electrode unlike in the production of conventional SIT structures. Furthermore, the light-emitting device can attain large current modulation at low voltages and has an increased ON/OFF ratio. The light-emitting device of the invention is thus simple in structure and is practical.

In the first and the second light-emitting devices of the present invention, it is preferred that (a) the organic EL layer comprise one, or two or more layers selected from a hole transporting layer, an electron transporting layer, a hole injection layer, and an electron injection layer, or that (b) the organic EL layer comprise an exciton-blocking layer.

(Display)

A display of the present invention comprises a substrate and a light-emitting device situated on the substrate, and the light-emitting device comprises an emitter electrode, a collector electrode, a semiconductor layer and a sheet base electrode between the emitter electrode and the collector electrode, and an organic EI layer between the base electrode and the collector electrode, the organic EL layer including at least one luminescent layer.

According to the present invention, there can be obtained a practical display.

According to the first transistor of the present invention, since the sheet base electrode is formed on the entire surface of the semiconductor layer to such a thickness that the ballistic electrons or holes accelerated due to the base voltage Vb can easily pass through the base electrode, the charges are significantly accelerated on the entire surface of the base electrode, and, moreover, the accelerated charges can easily pass through the base electrode. Consequently, the first transistor of the present invention can stably show current amplification effects comparable to those of bipolar transistors.

According to the second transistor of the present invention, since the dark current suppressor layer can effectively suppress the flow of dark current when a low or no voltage Vb is applied to the area between the emitter electrode and the base electrode, an increased ON/OFF ratio can be obtained. The second transistor can thus have enhanced contrast.

According to the process of the invention, for producing the second transistor, the dark current suppressor layer can be formed easily, and there can be easily provided a transistor having an ON/OFF ratio increased by suppressing the flow of leakage current.

According to the electronic device of the present invention, since the first or the second transistor can attain large current modulation at low voltages, it can provide, when combined with e.g., an organic EL device, an electronic device in which the first or the second transistor serves as a driving transistor, a switching element, for the organic EL device.

According to the light-emitting device of the present invention, the first or the second transistor in the light-emitting device comprises an organic EL layer between the base electrode and the collector electrode, and the organic EL layer comprises at least one luminescent layer, so that the light-emitting device can achieve surface light emission with a large current. In the production of the light-emitting device, a micro-patterning process is not necessary to make the base electrode unlike in the production of conventional SIT structures. Moreover, the light-emitting device can attain large current modulation at low voltages and has an increased ON/OFF ratio. The light-emitting device of the invention is thus simple in structure and is practical.

DETAILED DESCRIPTION OF THE INVENTION

A transistor, a process of producing it, a light-emitting device and a display according to the present invention will be described hereinafter in the order of a first transistor, a second transistor, a process of producing the second transistor, a light-emitting device, and a display. The present invention is not limited to the following embodiments and is susceptible to modification without departing from the spirit of this disclosure and the scope of the appended claims.

(First Transistor)

Figure 1:
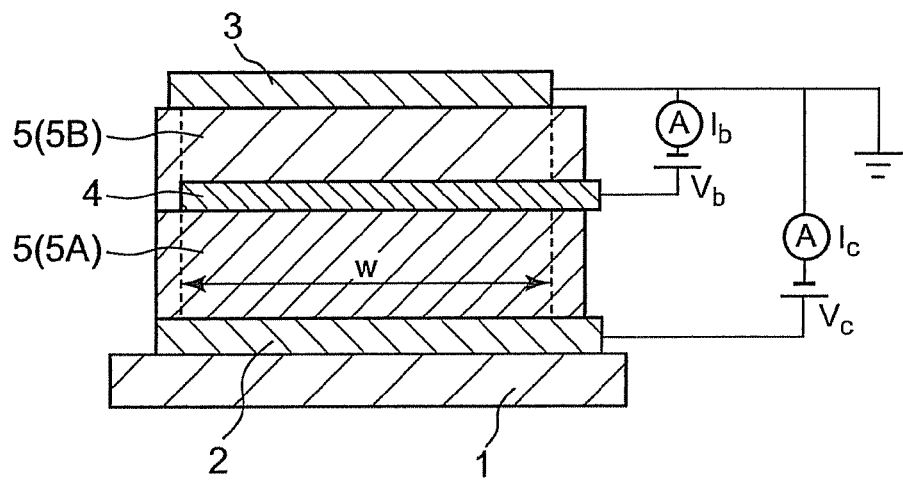
FIG. 1 is a schematic cross-sectional view of a first transistor of the present invention.

FIG. 1 is a schematic cross-sectional view of a first transistor of the present invention. A first transistor 10 of the invention comprises an emitter electrode 3, a collector electrode 2, and a semiconductor layer 5 (5A, 5B) and a sheet base electrode 4 between the emitter electrode 3 and the collector electrode 2, as shown in FIG. 1. Specifically, the semiconductor layer 5 is composed of a first semiconductor layer 5A situated between the collector electrode 2 and the base electrode 4, and a second semiconductor layer 5B situated between the emitter electrode 3 and the base electrode 4. Reference numeral 1 denotes a substrate. The advantage of the first transistor 10 having the above structure is that, although it is a vertical transistor, it is not necessary to make minute electrodes in the shape of grids or stripes by means of a micro-patterning process.

Specifically, a first transistor of the invention was made in the following manner. A transparent ITO electrode with a thickness of 100 nm was used as the collector electrode 2. On this electrode were deposited a perylene pigment (Me-PTC, n-type organic semiconductor) film with a mean thickness of 500 nm as the first semiconductor layer 5A, silicon oxide film with a thickness of 2.5 mm or 5 mm as the dark current suppressor layer 6, aluminum film with a mean thickness of 20 nm as the base electrode 4, fullerene ($C_{60}$) film with a mean thickness of 100 nm as the second semiconductor layer 5B, and silver film with a mean thickness of 30 nm as the emitter electrode 3 in the order named by such a means of film deposition as vacuum vapor deposition. The ON-state current and the OFF-state current were determined by measuring the change of collector current Ic and the change of base current Ib, with a collector voltage Vc of 5 V applied to between the emitter electrode and the collector electrode and with a base voltage Vb applied or not applied to between the emitter electrode and the base electrode.

Figure 2:
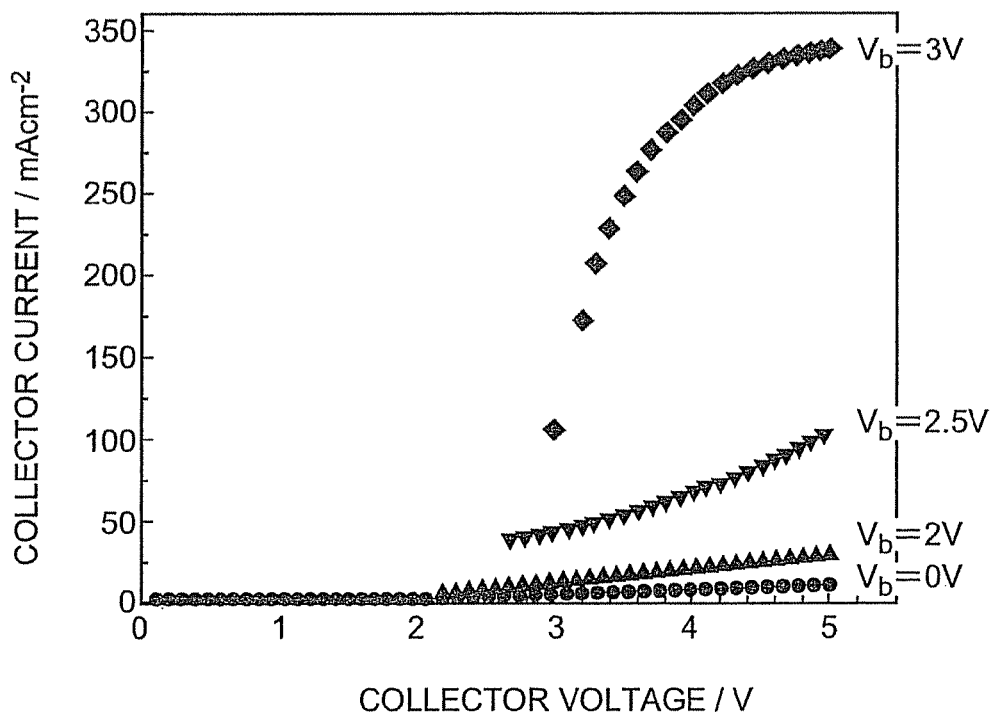
FIG. 2 is a graph showing the change of collector current with collector voltage.
Figure 3:
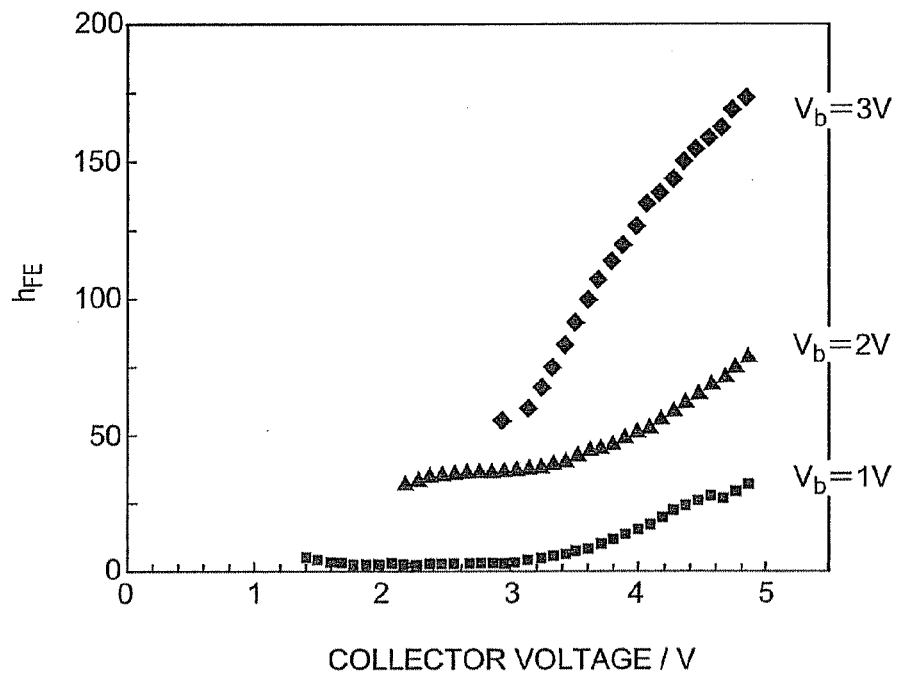
FIG. 3 is a graph showing the ratio of the change of base current to the change of collector current (current amplification factor ($h_{FE}$)).

FIG. 2 shows that, although almost no current flows between the emitter electrode and the collector electrode when no base voltage Vb is applied (Vb=0), the current increases significantly when a base voltage Vb is applied, proving that the current is modulated. As shown in the figure, the current density reaches 350 mA/cm² when Vc=5 V and Vb=3 V. This current density is equivalent to a current large enough to cause an organic EL device to emit light with a luminance of several thousands candelas per square meter, for example. Since FET structures generally require source-drain voltages and gate voltages of several tens volts, it is easily understood that the first transistor 10 according to the invention can attain large current modulation at low voltages. Furthermore, although the base electrode 4 is in direct contact with the semiconductor layer 5 in the first transistor 10, almost no current flows into the base electrode 4. Consequently, the ratio of the change of base current to the change of collector current, i.e., the current amplification factor ($h_{FE}$), exceeds 1 and reaches a maximum of 170, as shown in FIG. 3. It was thus confirmed that the first transistor of the invention effectively serves as a current-amplification transistor apparently similar to bipolar transistors.

Namely, the first transistor 10 of the invention comprises the semiconductor layer 5 (5A, 5B) between the emitter electrode 3 and the collector electrode 2, and the sheet base electrode 4 in the semiconductor layer 5, so that its transistor performance as shown in FIGS. 2 and 3 is based on the following principle: when a collector voltage Vc is applied to between the emitter electrode 3 and the collector electrode 2, and a base voltage Vb, to between emitter electrode 3 and the base electrode 4, charges (electrons or holes) injected from the emitter electrode 3 are significantly accelerated due to the base voltage Vb, and the accelerated charges pass through the base electrode 4 and arrive at the collector electrode 2. Namely, the current flowing between the emitter electrode and the collector electrode can be amplified by the application of a base voltage Vb. In this first transistor 10 of the invention, the sheet base electrode 4 is formed on the entire surface (the specified effective width W in FIG. 1) of the semiconductor layer to such a thickness that the ballistic electrons or holes accelerated due to the base voltage Vb can pass through it. Therefore, the charges are significantly accelerated on the entire surface of the base electrode formed, and, moreover, the accelerated charges can easily pass through the base electrode 4. Thus, according to the first transistor 10 of the invention, current amplification effects comparable to those of bipolar transistors can be stably obtained.

Explanation of the layers and the electrodes, components of the first transistor of the invention, will be given below.

(Substrate)

In FIG. 1, the first transistor of the invention is situated on a substrate. The type and the structure of the substrate 1 are not limited to particular ones, and they can be determined by the materials for the layers to be deposited on the substrate, and so forth. For example, a variety of materials including metals such as aluminum, glass, silica, and resins can be used for the substrate 1. In the case where the first transistor will be used in an organic light-emitting device of bottom emission type, which emits light from the substrate 1 side, like the light-emitting device according to the present invention that will be described later, it is preferable to use a transparent or semitransparent material for the substrate. On the other hand, when the first transistor will be used in an organic light-emitting device of top emission type, which emits light from the emitter electrode 3 side, it is not necessary to use a transparent or semitransparent material, and an opaque material may be used for the substrate.

Particularly, conventional materials for use as the substrates of organic EL devices, i.e., those materials used to support organic EL devices mechanically, can be favorably used in the invention. A certain type of material, e.g., a flexible material or a hard material, is selected for the substrate depending on the intended use of the transistor. Specific examples of materials herein useful for the substrate include glass, silica, polyethylene, polypropylene, polyethylene terephthalate, polymethacrylate, polymethyl methacrylate, polymethyl acrylate, polyesters, and polycarbonate. The substrate 1 may be either in sheet form or in continuous form. Specifically, the substrate 1 may be in such a form as a card, a film, a disc, or a chip.

(Electrodes)

Electrodes constituting the first transistor 1 of the invention are the collector electrode 2, the emitter electrode 3, and the base electrode 4. In general, the collector electrode 2 is situated on the substrate 1; the base electrode 4 is situated within the semiconductor layer 5 (first semiconductor layer 5A and second semiconductor layer 5B) as if it were embedded in the semiconductor layer 5; and the emitter electrode 3 is formed in parallel with the collector electrode 2 so that the two electrodes sandwich the semiconductor layer 5 and the base electrode 4, as shown in FIG. 1. Materials for the electrodes are thin films of metals, conductive oxides, conductive polymers, and so on. A barrier layer, a smoothening layer, etc. may be formed between the substrate 1 and the collector electrode 2.

For example, when the semiconductor layer 5, a component of the first transistor of the invention, is an electron transporting layer of an organic compound, materials that can be used to form the collector electrode 2 include compounds that form transparent conductive films, such as ITO (indium tin oxide), indium oxide, IZO (indium zinc oxide), $SnO_2$ and ZnO, metals whose work functions are large, such as gold and chromium, and conductive polymers such as polyaniline, polyacetylene, polyalkylthiophene derivatives and polysilane derivatives. And materials that can be used to form the emitter electrode 3 include metals whose work functions are small, e.g., single metals such as aluminum and silver, magnesium alloys such as MgAg, aluminum alloys such as AlLi, AlCa, and AlMg, alkaline metals such as Li and Ca, and alkaline metal alloys.

On the other hand, when the semiconductor layer 5, a component of the first transistor of the invention, is a hole transporting layer of an organic compound, the above materials enumerated as being useful for the collector electrode 2 can be used to form the emitter electrode 3, and the above materials enumerated as being useful for the emitter electrode 3 can be used to form the collector electrode 2.

Since the base electrode 4 forms Shottky contact with the material for the semiconductor layer 5, those materials that are enumerated above as being useful for the collector electrode 2 and for the emitter electrode 3 can be used to form the base electrode 4. The base electrode 4 acts to supply forcibly the charges supplied from the emitter electrode 3 into the first semiconductor layer 5A situated on the collector electrode 2 side. Therefore, the material for the base electrode 4 is not necessarily one that can easily inject charges into the first semiconductor layer 5A. However, when the first semiconductor layer 5A on the collector electrode 2 side is a hole injection layer, or a layer containing a hole injection material, it is preferable to form the base electrode 4 by the use of a material whose work function is small. On the other hand, when the first semiconductor layer 5A is an electron injection layer, or a layer containing an electron injection material, it is preferable to form the base electrode 4 by the use of a material whose work function is large. Examples of materials that can be favorably used to form the base electrode 4 include metals whose work functions are small, e.g., single metals such as aluminum and silver, magnesium alloys such as MgAg, aluminum alloys such as AlLi, AlCa, and AlMg, alkaline metals such as Li and Ca, and alkaline metal alloys such as LiF. If the semiconductor layer 5 can form Shottky contact with a charge (hole, electron) injection layer, a material selected from compounds capable of forming transparent conductive films, such as ITO (indium tin oxide), indium oxide, IZO (indium zinc oxide), $SnO_2$ and ZnO, metals whose work functions are large, such as gold and chromium, conductive polymers such as polyaniline, polyacetylene, polyalkylthiophene derivatives and polysilane derivatives, and the like can be used to form the base electrode 4.

In the case where the first transistor of the invention will be used in an organic light-emitting device of bottom emission type, which emits light from the substrate 1 side, like the light-emitting device according to the present invention that will be described later, it is preferred that at least the collector electrode 2 be formed by the use of a transparent or semitransparent material. On the other hand, when the first transistor will be used in an organic light-emitting device of top emission type, which emits light from the emitter electrode 3 side, it is preferable to use a transparent or semitransparent material to form both the base electrode 4 and the emitter electrode 3. The use of such materials for the electrodes can improve light extraction efficiency. Preferred examples of transparent or semitransparent materials useful as the electrodes include transparent conductive films of ITO (indium tin oxide), indium oxide, IZO (indium zinc oxide), $SnO_2$ and ZnO.

Of the above electrodes, the collector electrode 2 and the emitter electrode 3 are formed by a vacuum process such as vacuum vapor deposition, sputtering or CVD, or by a coating process. It is preferred that the film thickness of each electrode be in the range from 10 to 1000 nm, for example, although it varies depending on the material used, and so forth. The film thickness is herein a mean value of five measurements of the thickness of a sample, obtained by subjecting the cross section of the sample to measurement using a transmission electron microscope (TEM).

Figures 4A, 4B:
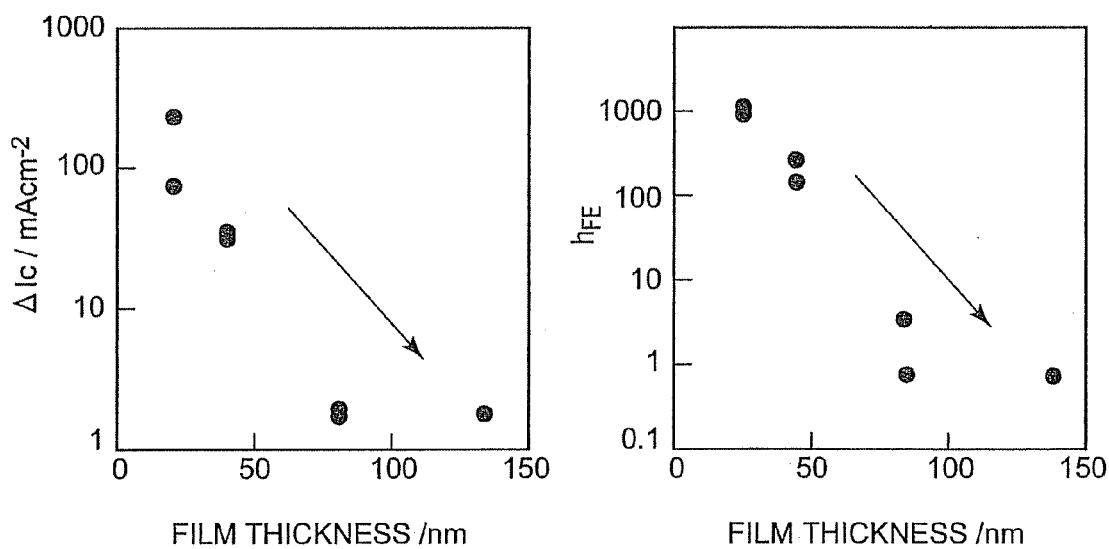
FIGS. 4(A) and 4(B) are graphs showing the dependence of modulated current Ic and current amplification factor $h_{FE}$ on base electrode thickness, respectively, obtained using a transistor having the same structure, except for the thickness of the base electrode, as the transistor used for the measurement whose results are shown in FIGS. 2 and 3.
Figure 5:
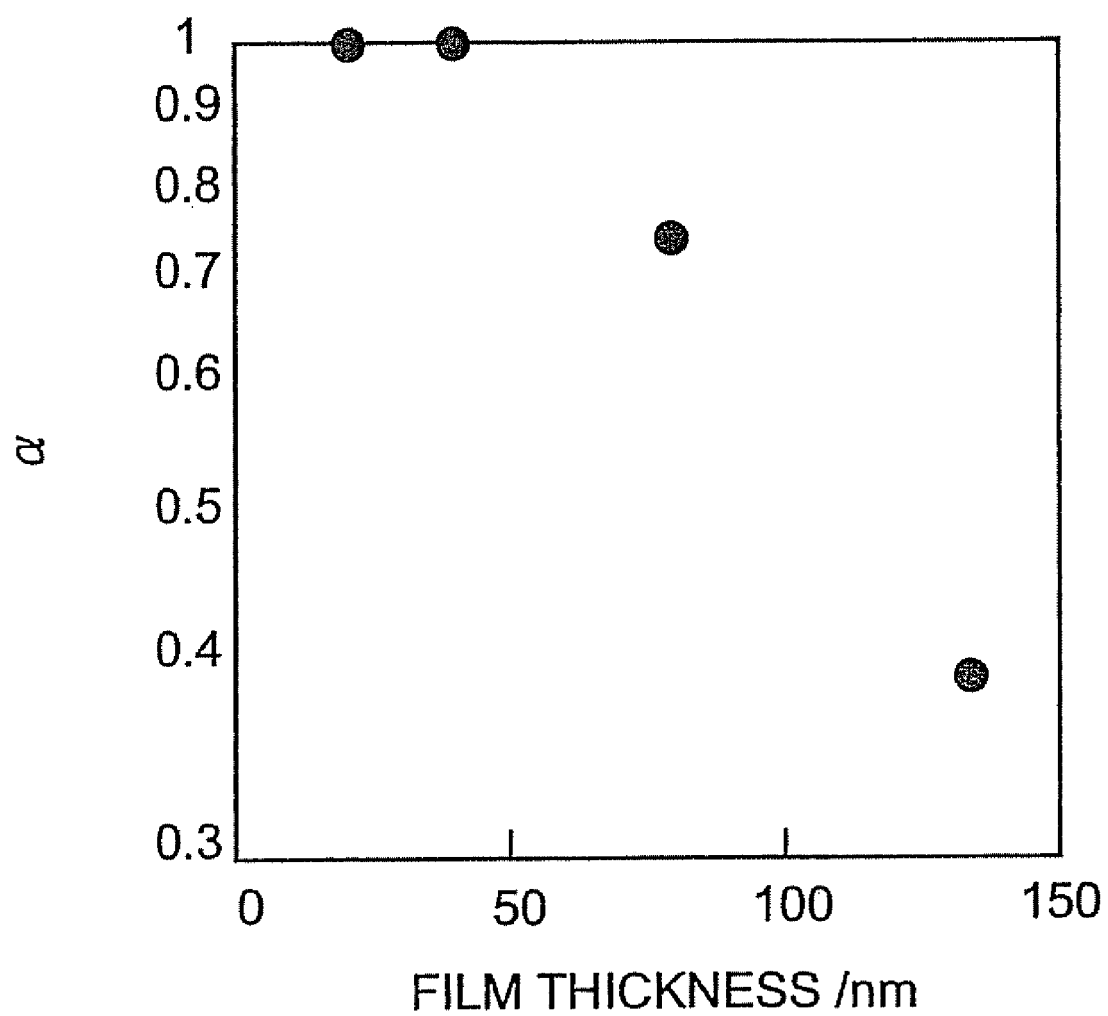
FIG. 5 is a graph showing the change in current transmission rate α with base electrode thickness.

FIGS. 4(A) and 4(B) are graphs showing the dependence of modulated current Ic and that of current amplification factor $h_{FE}$ on the thickness of the base electrode 4, respectively, obtained using a transistor having the same structure, except for the thickness of the base electrode 4, as the transistor used for the measurement whose results are shown in FIGS. 2 and 3. FIG. 5 is a graph showing the change in current transmission rate a with the thickness of the base electrode 4. The current transmission rate α shown in FIG. 5 is herein defined as [Ic (charges that have arrived at the collector electrode)]/[Ic+Ib (charges injected from the emitter electrode)].

The modulated current Ic and the current amplification factor $h_{FE}$ drastically decrease as the thickness of the base electrode 4 increases, as shown in FIG. 4, proving that small thickness is essential for the base electrode 4 to ensure satisfactory transistor performance. The current transmission rate α, which is the ratio of charges injected from the emitter electrode 3 to charges that have arrived at the collector electrode 2, is as extremely high as about 99% when the base electrode 4 has a thickness of 40 nm or less, as shown in FIG. 5. This means that almost all the charges emitted from the emitter electrode 3 pass through the base electrode 4, and it is thus considered that current amplification effects comparable to those of bipolar transistors are obtained.

It is therefore preferred that the thickness of the base electrode 4 be 40 nm or less, but even a base electrode 4 with a thickness up to 80 nm can also be used, as shown in FIG. 4. Since 40 nm or less is a thickness that allows the ballistic electrons or holes accelerated due to the base voltage Vb to pass easily through the base electrode 4 into the semiconductor layer, charges (electrons or holes) are significantly accelerated on the entire surface of the sheet base electrode 4, and, moreover, the accelerated charges can easily pass through the base electrode 4. Since the base electrode 4 can fulfil its purpose as long as it is situated in the semiconductor layer 5 as a continuous film (without discontinuities such as holes or cracks), the thickness of the base electrode 4 has no particular lower limit, and a thickness of about 1 nm is usually enough. The thickness of the base electrode 4 is a value obtained by subjecting the cross section of a sample to measurement using a transmission electron microscope.

Figure 6A:
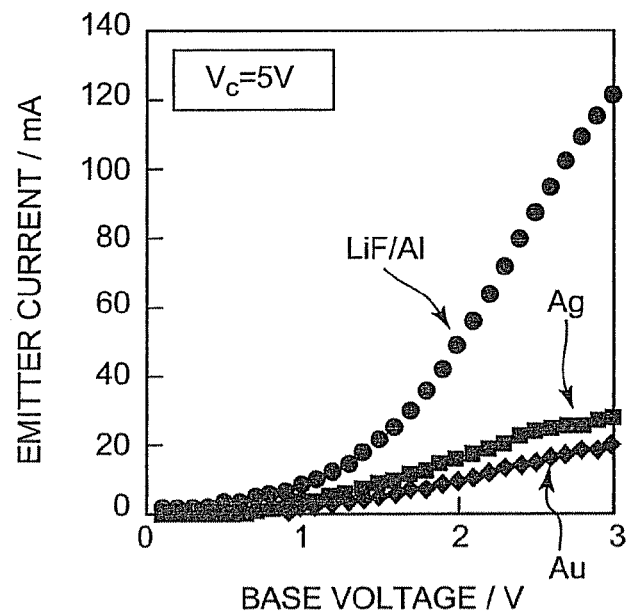
FIGS. 6(A) and 6(B) are graphs showing the base voltage dependence of the current injected from the emitter electrode and that of the current that has arrived at the collector electrode, respectively, obtained using samples comprising, as the base electrode, films of different materials.
Figure 6B:
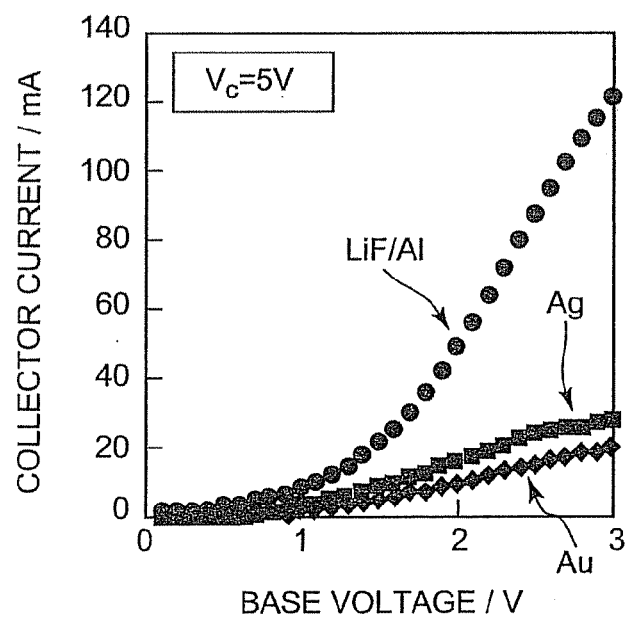

FIGS. 6(A) and 6(B) are graphs showing the base voltage dependence of the current injected from the emitter electrode 3 and that of the current that has arrived at the collector electrode 2, respectively, obtained using samples comprising, as the base electrode 4, films of different materials. The samples used for the measurement had the same structure as the transistor used for the measurement whose results are shown in FIGS. 2 and 3, provided that the thickness of the base electrode 4 was made 40 nm. Even when the base voltage Vb was changed, the current injected from the emitter electrode 3 was nearly equal to the current that has arrived at the collector electrode 2, as shown in FIG. 6, and the current transmission rate α [Ic/(Ic+Ib)] proved to be as high as 0.99 when the material for the base electrode 4 was LiF/Al, Au, or Ag.

Further, the comparison of the samples whose base electrodes 4 are LiF (thickness 0.5 nm)/Al (thickness 100 nm) layered film, Au film with a thickness of 30 nm, and Ag film with a thickness of 30 nm found that the samples were different in current value and that the current value gets smaller as the material for the base electrode 4 is varied in the order of LiF/Al, Ag and Au, as shown in FIG. 6. This result shows that the current value varies depending on the material for the base electrode 4, but the material dependence of current transmission rate α is low.

Although the mechanism that makes the current transmission rate α of the base electrode 4 high when the base electrode 4 is in sheet form and has a thickness of not more than a specified value is not yet clarified, a possible mechanism is presently as follows.

In the present invention, it is considered that when the base electrode 4 is in sheet form (i.e., when the base electrode 4 has no discontinuities such as holes or cracks), charges injected from the emitter electrode 3 are accelerated on the entire surface of the sheet base electrode 4, and almost all of the charges from the emitter electrode 3 become ballistic electrons or holes and pass through the base electrode 4. Consequently, it is assumed that the amount of the charges that have arrived at the collector electrode becomes nearly equal to the amount of the charges injected from the emitter electrode, and that current amplification effects can thus be significantly obtained, as a whole. On the other hand, we confirmed the following in the course of our studies. In a sample whose base electrode 4 is not in sheet form (i.e., in a sample whose base electrode 4 has discontinuities such as holes or cracks), the amount of the charges that have arrived at the collector electrode is smaller than that of the charges injected from the emitter electrode, and the ON/OFF ratio is also low. The reason for this is considered to be as follows: the charges injected from the emitter electrode 3 cannot be accelerated at the discontinuities in the base electrode 4, and the non-accelerated charges cannot easily pass through the base electrode 4, which leads to non-uniform increase in the current, varying depending on position.

Figure 7:
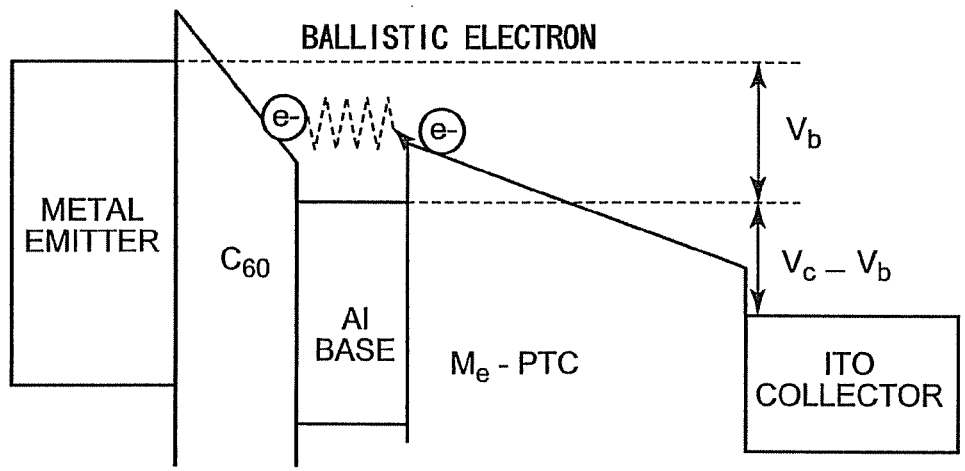
FIG. 7 is the energy diagram of a transistor of the present invention.

Further, when the base electrode 4 has a thickness below a specified value, it has a high current transmission rate a. A possible reason for this is that the charges injected from the emitter electrode 3 pass, as ballistic electrons or holes, through the base electrode 4. Namely, we consider that the base electrode 4 that is thin acts like the base layer of a bipolar transistor (i.e., acts to increase only the emitter current while preventing carriers from flowing in the base), and propose the energy diagram as shown in FIG. 7. As is clear also from the diagram shown in FIG. 7, the charge injection current flowing from the emitter electrode 3 into the $C_{60}$ film serving as the second semiconductor layer 5B is increased by the base voltage Vb applied to between the emitter electrode and the base electrode, and the charges arrive at the conduction band of the Me-PCT film serving as the first semiconductor layer 5A at high probability without falling in the base electrode 4 and are collected in the collector electrode 2. Consequently, great collector current modulation can be attained. It is generally said that the distance an electric charge can ballistically move in the base electrode 4 (the mean free path of an electron or hole) is from several nanometers to several tens nanometers. This distance agrees with the above experimental result in the invention showing that the thickness of the base electrode 4 is preferably 40 nm or less.

Furthermore, the base electrode 4 can have irregularities on its surfaces. The base electrode 4 having irregularities on its surfaces can be referred to as a base electrode having high surface roughness. Such a base electrode 4 has thin and thick portions even if it has been formed so that it has a specified mean thickness, and it is advantageous in that it can stably produce current amplification effects. The surface contour of the base electrode 4 having irregularities was evaluated with a contact surface contour meter (model DEKTAK3 manufactured by SLOAN TECHNOLOGY) or an AFM "SPI3800" manufactured by Seiko Instruments Inc., Japan.

For example, when the first semiconductor layer 5A has been formed on the collector electrode 2 by vacuum vapor deposition using a crystalline organic compound, it has irregularities on its surface on the side on which the base electrode 4 will be made. Therefore, the base electrode 4 formed on the crystalline first semiconductor layer 5A has irregularities, as well. The base electrode 4 has thin and thick portions even when it has been formed so that it has a specified mean thickness. According to the present invention, when the base electrode 4 has irregularities on its surface, current amplification effects can be obtained stably.

Preferred examples of materials useful for the crystalline semiconductor layer include the perylene pigment (Me-PTC), an n-type organic semiconductor, used in the transistor that gives the results shown in FIGS. 2 and 3. Other useful materials include $C_{60}$, NTCDA, PTCDA, and Ph-Et-PTC that are represented by the following chemical formulae. Organic compounds other than the above-described ones can also be used. The base-electrode 4-side surface of the perylene pigment (Me-PTC, n-type organic semiconductor) film with a thickness of 400 nm, deposited by vacuum vapor deposition, was analyzed by X-ray diffractometry. As a result, crystalline peaks were clearly observed. The base-electrode 4-side surfaces of the films of $C_{60}$, NTCDA, PTCDA, and Ph-Et-PTC were also analyzed by X-ray diffractometry, and, as a result, crystalline peaks were clearly observed. The surface roughness of the crystalline first semiconductor layer 5A in the transistor that gives the results shown in FIGS. 2 and 3 was reflected on the surface roughness of the base electrode 4 formed on the crystalline first semiconductor layer 5A. It was thus confirmed that current amplification effects can be obtained stably when the base electrode 4 in the transistor that gives the results shown in FIGS. 2 and 3 has specified surface roughness (irregularities).

The particle diameters of crystals making up the crystalline semiconductor layer can be measured with a transmission electron microscope, and they were nearly equal to the thickness of the base electrode 4 or more, specifically 50 nm or more. When the particle diameters of crystals making up the crystalline semiconductor layer 5A are equal to the thickness of the base electrode 4 or more, the base electrode 4 formed on the first semiconductor layer 5A can easily have irregularities. The surface roughness Rz of each crystalline semiconductor layer was determined with an AFM (SPI3800 manufactured by Seiko Instruments Inc., Japan) in accordance with JIS B0601. The results were as follows: the surface roughness Rz of the Me-PTC film was about 200 to 400 nm; that of the NTCDA film was about 300 to 500 nm; and that of the $C_{60}$ film was about 50 to 100 nm.

A metal can also be used to make the base electrode 4 and one or each side of the base electrode 4 may be covered with a thin film of an oxide of the metal. Further, when an electrode film is formed on the semiconductor layer 5 (5A, 5B), a protective layer (not shown in the figure) may be formed on the semiconductor layer 5 in order to minimize damage the semiconductor layer 5 sustains when the electrode film is formed on it. For the protective layer, it is preferable to form beforehand, by vacuum deposition or sputtering, a film that scarcely damages the semiconductor layer 5 when it is formed on it, such as a semitransparent film of Au, Ag, or Al, or an inorganic semiconductor film of ZnS or ZnSe, having a thickness in the order of 1 to 500 nm.

(Semiconductor Layer)

A variety of semiconductor materials can be used to form the semiconductor layer 5, a component of the first transistor of the invention, and charge transporting materials having excellent charge transporting characteristics are usually used. The form of the semiconductor layer 5 is preferably as follows: (i) the first semiconductor layer 5A situated between the collector electrode 2 and the base electrode 4 and the second semiconductor layer 5B situated between the emitter electrode 3 and the base electrode 4 are films of different semiconductor materials; (ii) the first semiconductor layer 5A and the second semiconductor layer 5B are films of hole or electron transporting materials; (iii) both the first semiconductor layer 5A situated between the collector electrode 2 and the base electrode 4 and the second semiconductor layer 5B situated between the emitter electrode 3 and the base electrode 4 are films of organic compounds; (iv) the thickness of the first semiconductor layer 5A situated between the collector electrode 2 and the base electrode 4 (T1) and the thickness of the second semiconductor layer 5B situated between the emitter electrode 3 and the base electrode 4 (T2) are in a ratio (T1/T2) ranging from 1/1 to 10/1, preferably from 3/1 to 7/1; (v) a charge injection layer is situated between the emitter electrode 3 and the second semiconductor layer 5B adjacent to the emitter electrode 3; and (iv) the charge injection layer is a film of an alkaline metal such as LiF or Ca, or a compound thereof.

Examples of materials useful for the semiconductor layer 5 (5A, 5B) include $Alq_3$, $C_{60}$, NTCDA, PTCDA, Me-PTC, and Ph-Et-PTC, which were used in the following Examples. Besides these materials, it is possible to use those materials that are usually used as charge transporting materials, such as anthraquinodimethane, fluorenylidene methane, tetracyanoethylene, fluorenone, diphenoquinone oxadiazole, anthrone, thiopyranedioxide, diphenoquinone, benzoquinone, malononitrile, dinitrobenzene, nitroanthraquinone, maleic anhydride and perylene tetracarboxylic acid, derivatives of these compounds. For the first semiconductor layer 5A to be situated between the collector electrode 2 and the base electrode 4, luminescent layer-forming materials that will be enumerated in the following description of a light-emitting device of the invention may also be used.

It is desirable that the charge mobility in the semiconductor layer 5 (5A, 5B) be as high as possible and be at least 0.001 $cm^2/Vs$. The thickness of the first semiconductor layer 5A situated on the collector electrode 2 side is usually about 300 to 1000 nm, preferably about 400 to 700 nm. When this thickness is less than 300 nm or in excess of 1000 nm, the transistor action may not occur. On the other hand, it is desirable that the thickness of the second semiconductor layer 5B situated on the emitter electrode 3 side be basically smaller than that of the first semiconductor layer 5A. The thickness of the second semiconductor layer 5B is usually about 500 nm or less, preferably about 50 to 150 nm. When the second semiconductor layer 5B has a thickness of less than 50 nm, continuity may occur, which leads to decrease in yield.

Experiments were carried out using the following organic compounds to form the first semiconductor layer 5A on the collector electrode 2. For the experiment was used a transistor made by forming a film of one of the five compounds, $Alq_3$, $C_{60}$, NTCDA, PTCDA and Me-PTC, as the first semiconductor layer 5A, aluminum film with a mean thickness of 20 nm as the base electrode 4, fullerene ($C_{60}$) film with a mean thickness of 100 nm as the second semiconductor layer 5B, and silver film with a mean thickness of 30 nm as the emitter electrode 3 in the order named on a transparent ITO electrode with a thickness of 100 nm, the collector electrode 2, by such a means of film deposition as vacuum vapor deposition. The thickness of the first semiconductor layer 5A was as follows: the thickness of the Alq$_3$ or C$_{60}$ film was 100 nm, and that of the NTCDA, PTCDA or Me-PTC film was 100 nm.

To these five transistors, a base voltage Vb of 0 V to 3 V was applied while applying a constant collector voltage Vc of 5 V. The output modulation characteristics were evaluated by measuring the amount of the change of collector current Ic and the amount of the change of base current Ib when the collector voltage Vc was applied to between the emitter electrode and the collector electrode and a base voltage Vb of 0 V to 3 V was further applied to between the emitter electrode and the base electrode like in the measurement whose results are shown in FIGS. 2 and 3. Further, the ratio of the change of base current to the change of collector current, i.e., the current amplification factor (h$_{FE}$), was obtained by calculation. Table 1 shows the results.

TABLE 1

|  | Δ IC (mA/cm$^2$) | h$_{FE}$ | ON-OFF ratio |
|---|---|---|---|
| Alq$_3$ | — | — | — |
| C$_{60}$ | 0.0075 | ~1 | 1.5 |
| NTCDA | 4.65 | 15 | 40 |
| PTCDA | 175 | 46 | 20 |
| Me-PTC | 300 | 200 | 100 |

[Chemical Formulae 1]

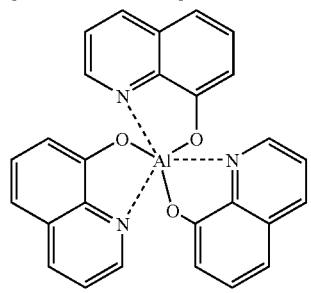

Alq$_3$

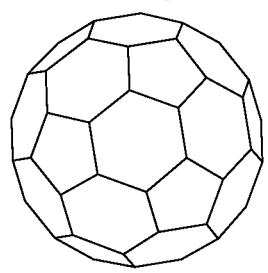

C$_{60}$

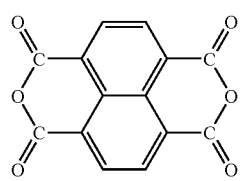

NTCDA

TABLE 1-continued

|  | Δ IC (mA/cm$^2$) | h$_{FE}$ | ON-OFF ratio |
|---|---|---|---|

[Chemical Formulae 2]

PTCDA

Me-PTC

As shown in Table 1, the transistor comprising the C$_{60}$ film as the second semiconductor layer 5B and the Alq$_3$ or C$_{60}$ film as the first semiconductor layer 5A did not show satisfactory results. The transistor whose first semiconductor layer 5A was the NTCDA film and the transistor whose first semiconductor layer 5A was the PTCDA film achieved current amplification, and their current amplification factors (h$_{FE}$) were 15 and 46, respectively. Further, the current amplification factor (h$_{FE}$) of the transistor comprising the Me-PTC film as the first semiconductor layer 5A was as extremely high as 200. Thus, charge transporting materials can be used to form the semiconductor layer 5 (5A, 5B), a component of the first transistor of the invention, and satisfactorily great current amplification effects can be obtained when the materials are used in proper combination. It is presently considered that the proper combination of the charge transporting materials is determined by the position of LUMO of the semiconductor material used, as shown in FIG. 7. It is therefore desirable to use the charge transporting materials in combination with consideration for this point.

The ON/OFF ratios of the transistors, determined by applying a collector voltage Vc of 5 V, and an ON-state base voltage Vb of 3 V or an OFF-state base voltage Vb of 0 V, are also shown in Table 1. As shown in Table 1, the ON/OFF ratio of the transistor comprising as the first semiconductor layer 5A the NTCDA film and that of the transistor comprising as the first semiconductor layer 5A the PTCDA film were high, and they were 40 and 20, respectively. Further, the transistor comprising the Me-PTC film as the first semiconductor layer 5A had an extremely high ON/OFF ratio of 100.

It was thus confirmed that the first transistor of the present invention effectively function as a current amplification transistor like a bipolar transistor.

(Second Transistor)

Figure 8:
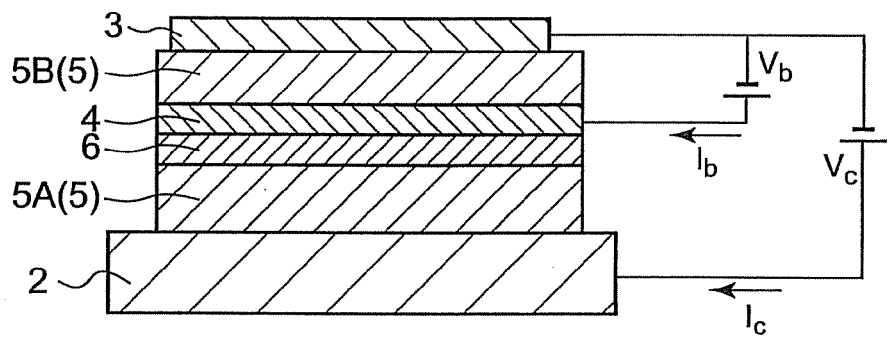
FIG. 8 is a schematic cross-sectional view of a second transistor of the present invention.
Figure 9:
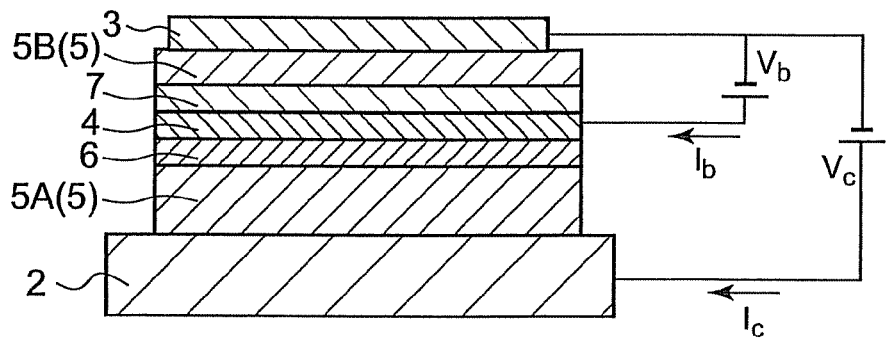
FIG. 9 is a schematic cross-sectional view of another second transistor of the present invention.

Next, a second transistor of the present invention will be described. FIG. 8 is a schematic cross-sectional view of a second transistor of the invention, and FIG. 9 is a schematic cross-sectional view of another second transistor of the invention. The second transistors 20 and 30 of the invention comprise an emitter electrode 3 and a collector electrode 2. Between the emitter electrode 3 and the collector electrode 2 are situated a semiconductor layer 5 and a sheet base electrode 4, and a dark current suppressor layer (dark current correction layer) 6, 7 is situated at least between the emitter electrode 3 and the base electrode 4, or between the collector electrode 2 and the base electrode 4. In FIG. 8, the dark current suppressor layer 6 is situated between the collector electrode 2 and the base electrode 4. In FIG. 9, the dark current suppressor layer 6 is situated between the collector electrode 2 and the base electrode 4, and another dark current suppressor layer 7, between the emitter electrode 3 and the base electrode 4.

The second transistor of the invention is the same as the above-described first transistor of the invention, except that the former comprises the dark current suppressor layer(s), so that, in FIGS. 8 and 9 and in the following description, the components of the second transistor, excluding the dark current suppressor layer, are denoted by the reference numerals used to denote the corresponding components of the first transistor and will not be described any more. Further, a substrate is omitted from FIGS. 8 and 9.

Figure 10:
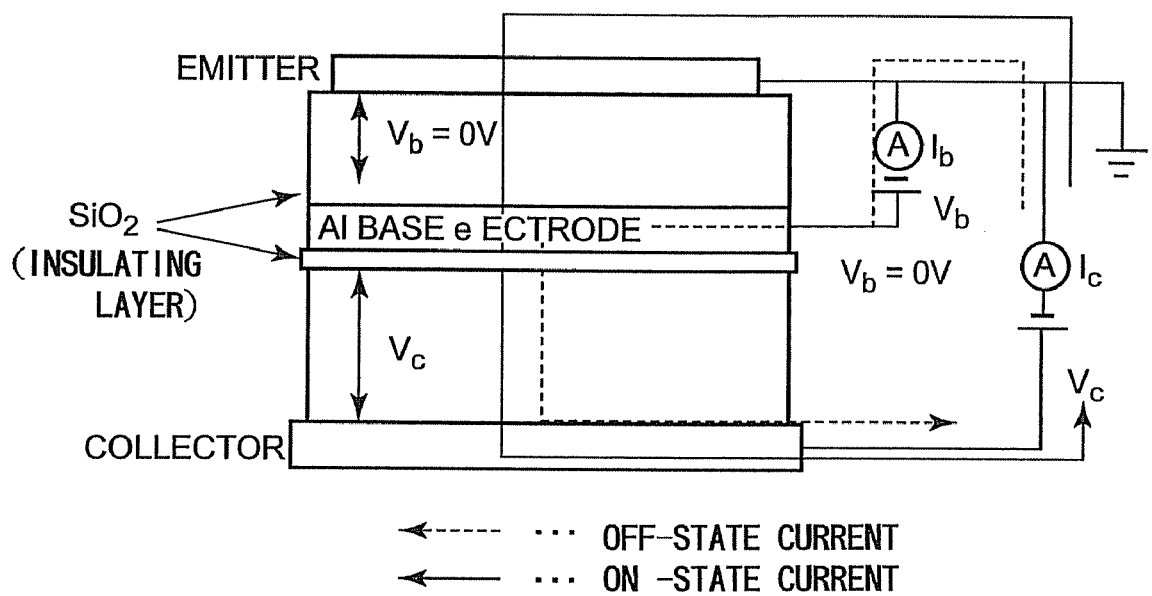
FIG. 10 is a view showing the path of the ON-state current and that of the OFF-state current in the second transistor shown in FIG. 8.
Figure 11:
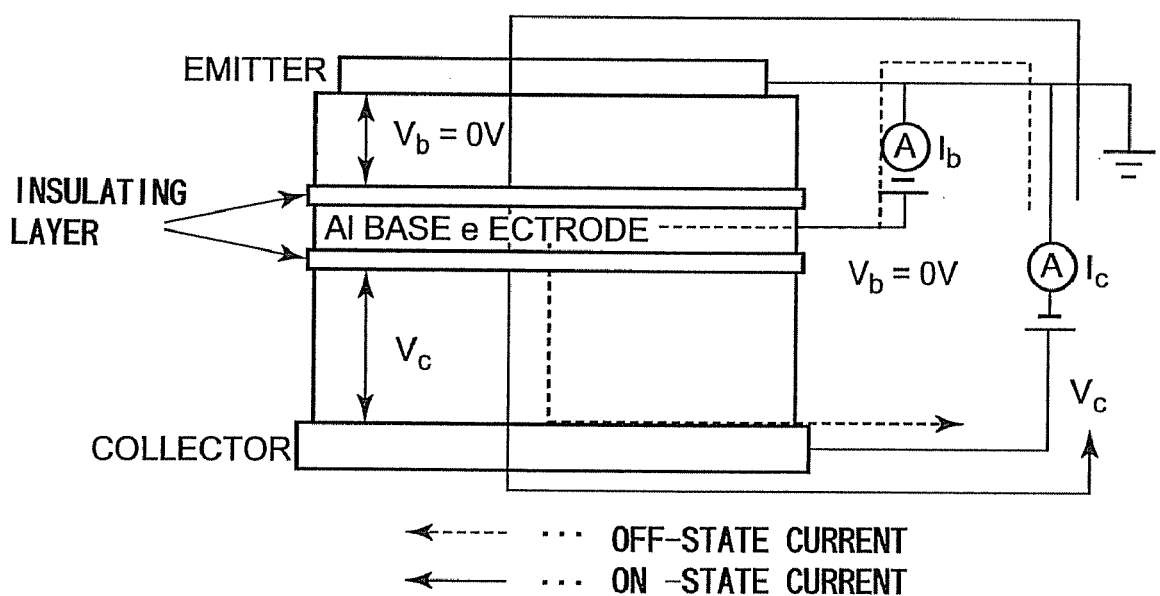
FIG. 11 is a view showing the path of the ON-state current and that of the OFF-state current in the second transistor shown in FIG. 9.

FIG. 10 shows the path of the ON-state current and that of the OFF-state current in the second transistor 20 shown in FIG. 8, and FIG. 11 shows the path of the ON-state current and that of the OFF-state current in the second transistor 30 shown in FIG. 9. The second transistors 20, 30 are for solving the problem that, when a collector voltage Vc of e.g., 5 V is applied to between the emitter electrode and the collector electrode in the first transistor 10, leakage current, other than the current component necessary to operate the transistor, sometimes flows between the base electrode and the collector electrode if a low or no voltage Vb is applied to between the emitter electrode and the base electrode, which leads to decrease in ON/OFF ratio. The second transistors 20, 30 have ON/OFF ratios increased by suppressing the flow of leakage current, unnecessary current for the operation of the transistor, by forming a dark current suppressor layer (dark current correction layer) (6,7) on one or each side of the thin sheet base electrode 4 situated in the semiconductor layer 5.

According to the second transistor 20, 30 of the present invention, the dark current suppressor layer (6, 7) is situated at least between the emitter electrode 3 and the base electrode 4, or between the collector electrode 2 and the base electrode 4, so that dark current, unnecessary current for the operation of the transistor, is effectively prevented from flowing between the base electrode and the collector electrode when a low or no voltage Vb is applied to between the emitter electrode and the base electrode, resulting in increase in ON/OFF ratio. Desirably, the dark current suppressor layer 6, 7 acts in such a way that it effectively suppresses the flow of dark current when no voltage Vb is applied to between the emitter electrode and the base electrode, but that it does not suppress so much the flow of so-called ON-state current when a voltage Vb is applied to between the emitter electrode and the base electrode.

Since the dark current suppressor layer 6, 7 acts to allow the emitter current generated by the collector voltage Vc not to flow through the base electrode 4 when no base voltage Vb is applied, it is formed at least between the collector electrode 2 and the base electrode 4, as shown in FIG. 8. The dark current suppressor layers 6 and 7 can be formed on both surfaces of the base electrode 4, as needed. It is preferable to form the dark current suppressor layer so that it is situated next to the base electrode 4 (i.e., it is in contact with the base electrode 4).

It is preferred that the dark current suppressor layer be formed uniformly on the base electrode 4. "Uniformly" herein means that the dark current suppressor layer is formed on the entire surface of the base electrode without holes or discontinuities. When the thickness of the dark current suppressor layer is set to an excessively small value, it is not easy to form the dark current suppressor layer uniformly. On the other hand, when the dark current suppressor layer has an excessively great thickness, it also suppresses significantly the flow of current when no base voltage Vb is applied.

Examples of materials useful for the dark current suppressor layer include organic and inorganic insulating materials. It is necessary that the material for the dark current suppressor layer can form a film with a thickness that fulfills the above-described requirement, and that the film formed can act to suppress dark current. When these requirements are taken into consideration, the following materials can be enumerated as specific examples of materials useful for the dark current suppressor layer: inorganic materials such as $SiO_2$, SiNx and $Al_2O_3$, and organic materials such as polychloroprene, polyethylene terephthalate, polyoxymethylene, polyvinyl chloride, polyvinylidene fluoride, cyanoethylpurlane, polymethyl methacrylate, polyvinylphenol, polysulfone, polycarbonate and polyimide. These materials may be used either singly or in combination.

Organic or inorganic semiconductor materials can also be used to form the current dark suppressor layer. From these materials, an optimal one is selected with consideration for the above requirements that the material can form a film with a thickness fulfilling the above-described requirement, and that the film formed can act as the dark current suppressor layer. These semiconductor materials may be used either singly or in combination.

Figure 12:
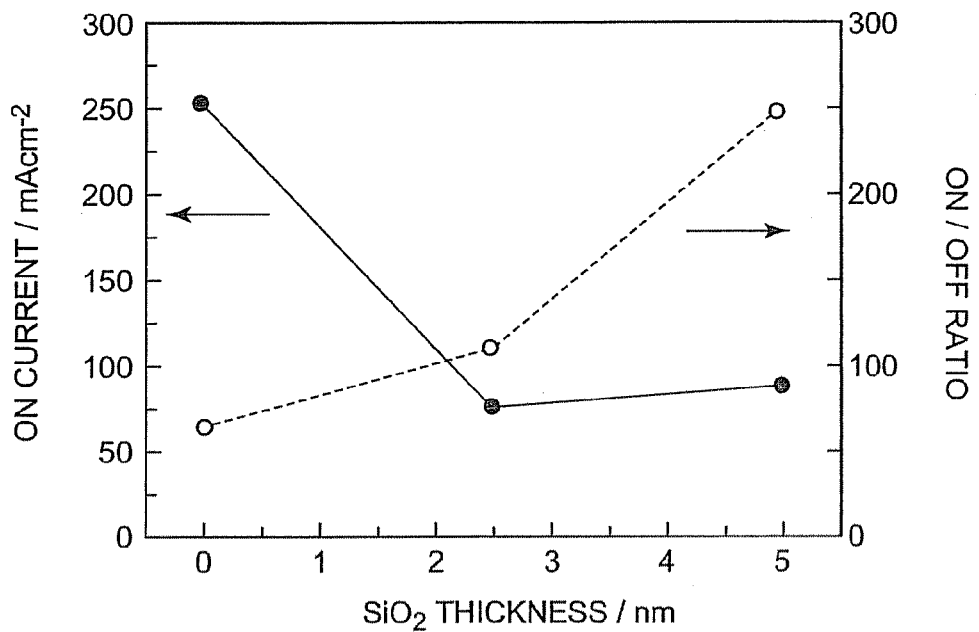
FIG. 12 is a graph showing ON-state currents and ON/OFF ratios when silicon oxide film is present as a dark current suppressor layer.

FIG. 12 is a graph showing ON-state currents and ON/OFF ratios obtained when the dark current suppressor layer is silicon oxide film. Transistors were made in the following manner: on a transparent ITO electrode with a thickness of 100 nm, the collector electrode 2, were deposited Me-PTC film with a thickness of 400 nm as the first semiconductor layer 5A, aluminum film with a mean thickness of 20 nm as the base electrode 4, fullerene ($C_{60}$) film with a mean thickness of 100 nm as the second semiconductor layer 5B, and silver film with a mean thickness of 30 nm as the emitter electrode 3 in the order named by such a means of film deposition as vacuum vapor deposition. Further, a transistor comprising no silicon oxide film was made as a control. Using these transistors, experiments were carried out.

The ON-state current and the OFF-state current of each transistor were measured. The value of the collector current obtained when a base voltage Vb was applied to between the emitter electrode and the base electrode, with a collector voltage Vc of 5 V applied to between the emitter electrode and the collector electrode, was taken as the ON-state current, while the value of the collector current obtained when no base voltage Vb was applied was taken as the OFF-state current. The ON/OFF ratio when the thickness of the silicon oxide film, the dark current suppressor layer, was 5 nm was about 250. Although the ON-state current in this case was lower than that in the case where no silicon oxide film was present, it was not so different from the ON-state current in the case where the thickness of the silicon oxide film was 2.5 nm. This is favorable because it means that it is possible to increase the ON/OFF ratio without decreasing the ON-state current greatly.

Figure 13:
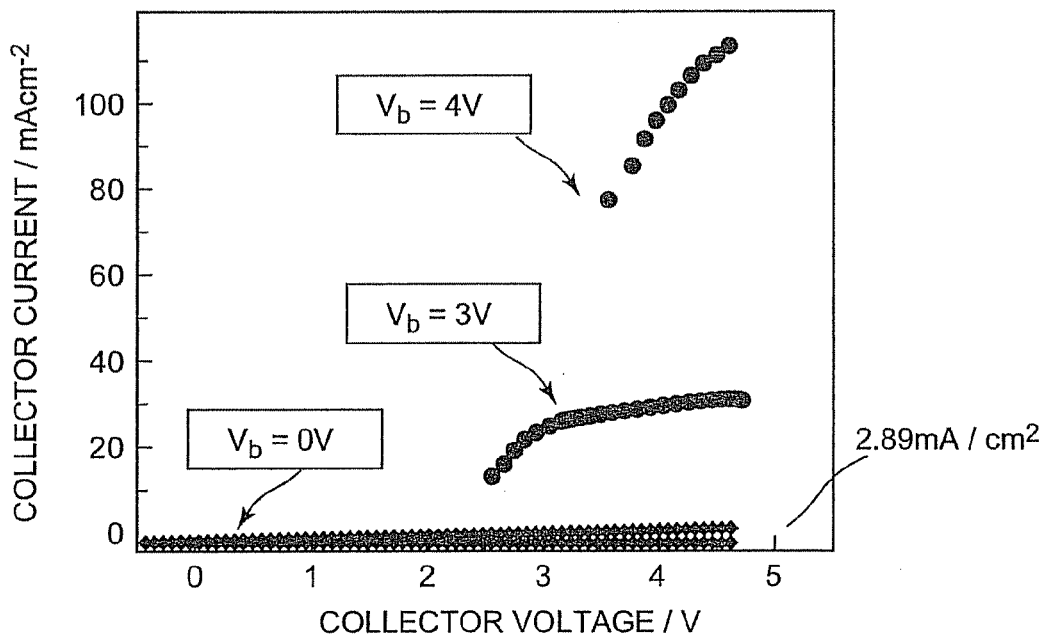
FIG. 13 is a graph showing the relationship between the collector current and the collector voltage when no dark current suppressor layer is present.
Figure 14:
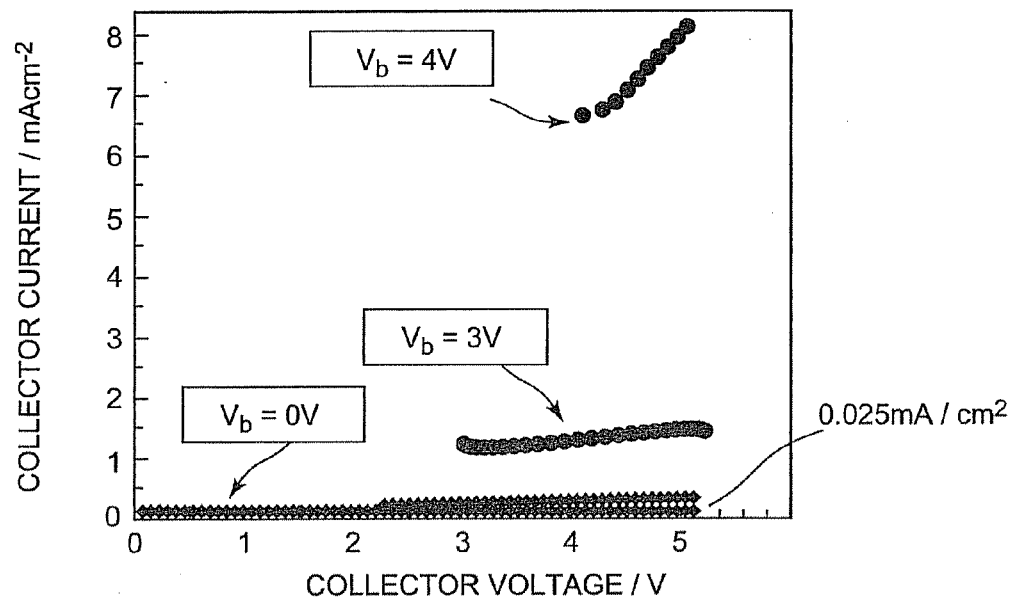
FIG. 14 is a graph showing the relationship between the collector current and the collector voltage when a dark current suppressor layer formed by natural oxidation is present.

FIGS. 13 and 14 show the change of collector current with time in the case where a dark current suppressor layer formed by natural oxidation was present. FIG. 13 is a graph showing collector currents when no dark current suppressor layer was present, and FIG. 14 is a graph showing collector currents when a dark current suppressor layer formed by natural oxidation was present. Experiments were carried out using transistors that had been made in the following manner: on a transparent ITO electrode with a thickness of 100 nm, the collector electrode 2, were deposited Me-PTC film with a mean thickness of 400 nm as the first semiconductor layer 5A, aluminum film with a mean thickness of 20 nm as the base electrode 4, fullerene ($C_{60}$) film with a mean thickness of 100 nm as the second semiconductor layer 5B, and silver film with a mean thickness of 30 nm as the emitter electrode 3 in the order named by such a means of film deposition as vacuum vapor deposition.

A collector voltage Vc of 0 to 5 V was applied to between the emitter electrode and the collector electrode in each transistor. The value of the collector current obtained when a base voltage Vb of 3 V or 4 V was applied to between the emitter electrode and the base electrode was taken as the ON-state current, while the value of the collector current obtained when no base voltage Vb was applied was taken as the OFF-state current. Shown in FIG. 13 were the results obtained immediately after making the transistor, in which both surfaces of the base electrode 4 had not yet been covered with dark current suppressor layers 6, 7. On the other hand, shown in FIG. 14 were the results obtained after leaving the transistor in an atmospheric environment in a room at a temperature of 20 to 25° C. and a relative humidity of 30 to 70% RH for 37 minutes, both surfaces of the base electrode 4 in the transistor being covered with aluminum oxide films serving as the dark current suppressor layers 6, 7.

The aluminum oxide films were films formed by the natural oxidation of the aluminum film serving as the base electrode 4, and they were observed in thickness measurement using a TEM.

Figure 15:
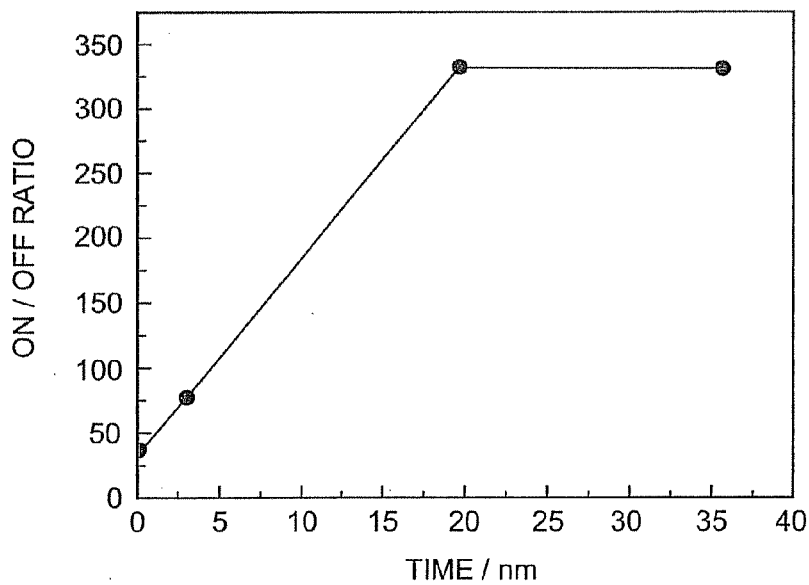
FIG. 15 is a graph showing the relationship between the time for which a transistor has been left in the air after production and the ON/OFF ratio.

In FIG. 13, the OFF-state current at a collector voltage Vc of 5 V and a base voltage Vb of 0 V was 2.89 mA/cm$^2$, while in FIG. 14, the OFF-state current at a collector voltage Vc of 5 V and a base voltage Vb of 0 V was 0.0025 mA/cm$^2$. The ON/OFF ratio that is 36 in FIG. 13 was increased significantly to 330 as shown in FIG. 14. FIG. 15 shows the relationship between the time for which the transistor was left in an atmospheric environment in a room at a temperature of 20 to 25° C. and a relative humidity of 30 to 70% RH and the ON/OFF ratio. The ON/OFF ratio increased significantly as the time for which the transistor was left in the above environment increased to 20 minutes and remained constant at a great value of more than 300 after the time for which the transistor left in the above environment exceeded 20 minutes. It was confirmed that the thickness of the aluminum oxide film increased with time; the thickness of the aluminum oxide film measured after the transistor had been left in the above environment for 37 minutes was greater than that of the aluminum oxide film measured after the transistor had been left in the environment for 20 minutes. It is considered that these results were obtained due in large part to the effect of the aluminum oxide film on the collector electrode 2 side, when the results shown in FIG. 12 are also taken into consideration.

The other components of the second transistor of the present invention are the same as those of the first transistor; that is, the materials for the electrodes and that for the semiconductor layer are the same as those mentioned in the description of the first transistor.

(Process of Producing Transistor)

A process of the present invention, for producing a transistor, is a process of producing the above-described second transistor of the invention and comprises the steps of forming a semiconductor layer 5 (5A, 5B) and a sheet base electrode 4 between an emitter electrode 3 and a collector electrode 2, and forming a dark current suppressor layer (6, 7) at least between the emitter electrode 3 and the base electrode 4, or between the collector electrode 2 and the base electrode 4. The characteristic feature of this process is that the dark current suppressor layer is formed by chemical reaction of the base electrode 4. Such a method of forming the dark current suppressor layer by making use of a chemical reaction includes a method in which after forming a base electrode 4, the base electrode 4 is partially oxidized (the semiconductor-layer-side surface of the base electrode 4 is oxidized) to form a dark current suppressor layer (6, 7), and a method in which after forming a base electrode 4, the base electrode 4 is thermally treated to form a dark current suppressor layer (6, 7), as described in the explanation of the experimental results shown in FIGS. 12, 13 and 14. The dark current suppressor layer (6, 7) can be formed easily by such a method, and there can be easily provided a transistor having an ON/OFF ratio increased by suppressing the flow of leakage current.

In the case where the dark current suppressor layer is formed only on the collector electrode 2 side, if a protective layer is formed on the base electrode 4 formed on the first semiconductor layer 5, for the purpose of preventing the base electrode 4 from undergoing chemical reaction such as oxidation, a film that acts as the dark current suppressor layer can be formed only on the collector electrode 2 side by naturally or thermally oxidizing the base electrode 4.

(Electronic Device)

Preferably, an electronic device of the present invention comprises, as a switching element, the above-described first or second transistor of the invention. The present invention provides an electronic device comprising e.g., an organic EL device and the first or second transistor that serves as a switching element for the organic EL device. Since the first or the second transistor can attain large current modulation at low voltages, it can be favorably combined with e.g., an organic EL device to provide an electronic device, in which it serves as a driving transistor, a switching element, for the organic EL device.

In the case where the transistor of the present invention is used as an n-type transistor, if an electronic device is made so that it has an organic EL layer between the base electrode 4 and the collector electrode 2, and that the base electrode 4 serves as the cathode, there can be obtained the excellent effect that charges can be effectively injected into the charge transporting material constituting the organic EL layer without using for the cathode an alkaline metal, to which electrons can be easily injected, but which readily undergoes oxidation, unlike in conventional electronic devices.

(Light-Emitting Device)

Figure 16:
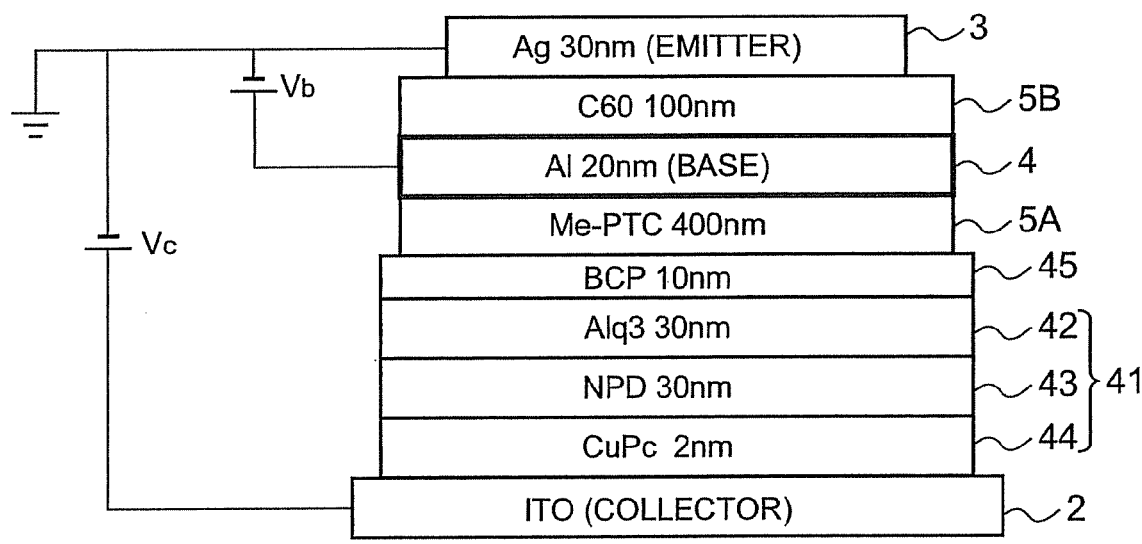
FIG. 16 is a schematic cross-sectional view of a light-emitting device comprising a first transistor of the invention and an organic EL layer between the base electrode and the collector electrode of the first transistor, the organic EL layer comprising at least one luminescent layer.

Next, a light-emitting device of the invention will be described. FIG. 16 is a schematic cross-sectional view of a light-emitting device 40 comprising an organic EL layer 41 between the base electrode 4 and the collector electrode 2 of the first transistor, the organic EL layer 41 comprising at least one luminescent layer 42. As shown in FIG. 16, the first light-emitting device 40 is made in the following manner, for example: on a transparent ITO electrode with a thickness of 100 nm, the collector electrode 2, are formed CuPc film with a thickness of 2 nm as the hole injection layer 44, NPD film with a thickness of 30 nm as a hole transporting layer 43, $Alq_3$ with a thickness of 30 nm as the luminescent layer 42, BCP film with a thickness of 10 nm as an exciton-blocking layer 45, a perylene pigment (Me-PTC, n-type organic semiconductor material) film with a thickness of 500 nm as the electron transporting first semiconductor layer 5A, aluminum film with a thickness of 20 nm as the base electrode 4, fullerene ($C_{60}$) film with a thickness of 100 nm as the second semiconductor layer 5B, and silver film with a thickness of 30 nm as the emitter electrode 3 in the order named by such a means of film deposition as vacuum vapor deposition.

Figure 17:
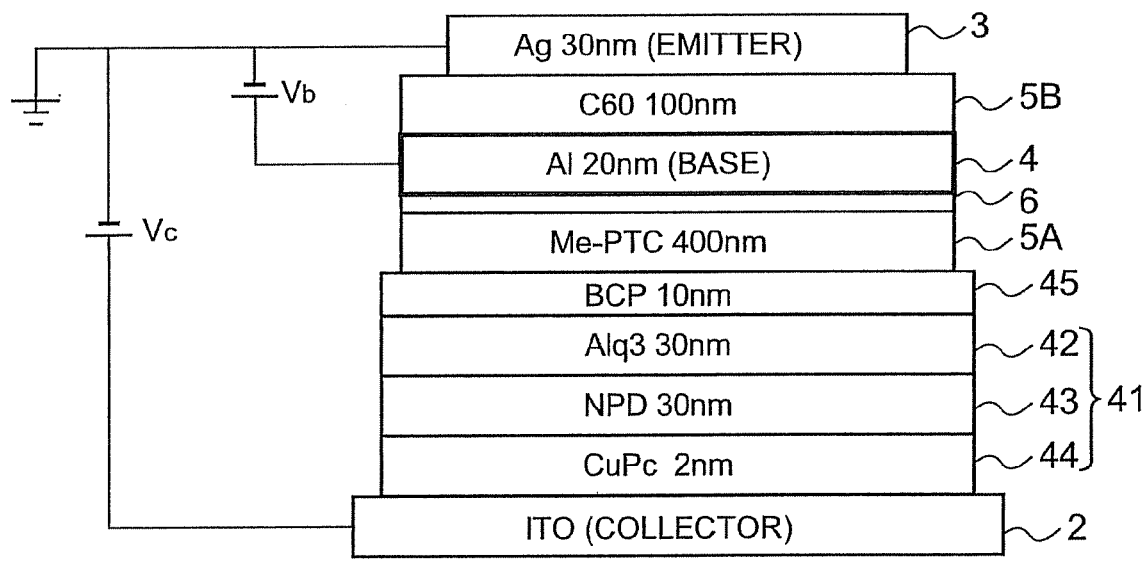
FIG. 17 is a schematic cross-sectional view of a light-emitting device comprising a second transistor of the invention and an organic EL layer between the base electrode and the collector electrode of the second transistor, the organic EL layer comprising at least one luminescent layer.

FIG. 17 is a schematic cross-sectional view of a light-emitting device 50 comprising an organic EL layer 41 between the base electrode 4 and the collector electrode 2 of the second transistor, the organic EL layer 41 comprising at least one luminescent layer 42. The second light-emitting device 50 has the same structure as the above-described first light-emitting device 40, except that silicon oxide film with a thickness of 5 nm is situated as the dark current suppressor layer 6 between the first semiconductor layer 5A and the base electrode 4, as shown in FIG. 17.

The transistor structures of the light-emitting devices 40, 50 of the present invention shown in FIGS. 16 and 17, respectively, are basically the same as those of the aforementioned first and second transistors. In the following description, therefore, the components of the light-emitting devices 40, 50 that are denoted by the reference numerals used to denote the corresponding components of the first and the second transistors will not be described in detail any more. The following are the chemical formulae of the materials used to form the organic EL layer, a component of the light-emitting device 40 or 50 shown in FIG. 16 or 17.

[Chemical Formulae 3]

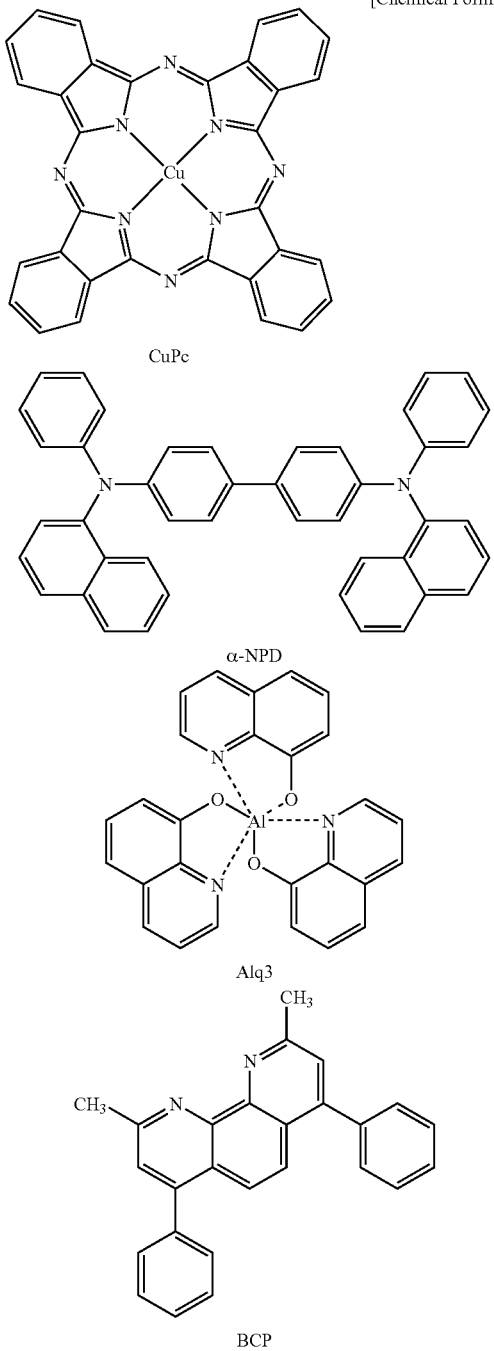

Figure 18:
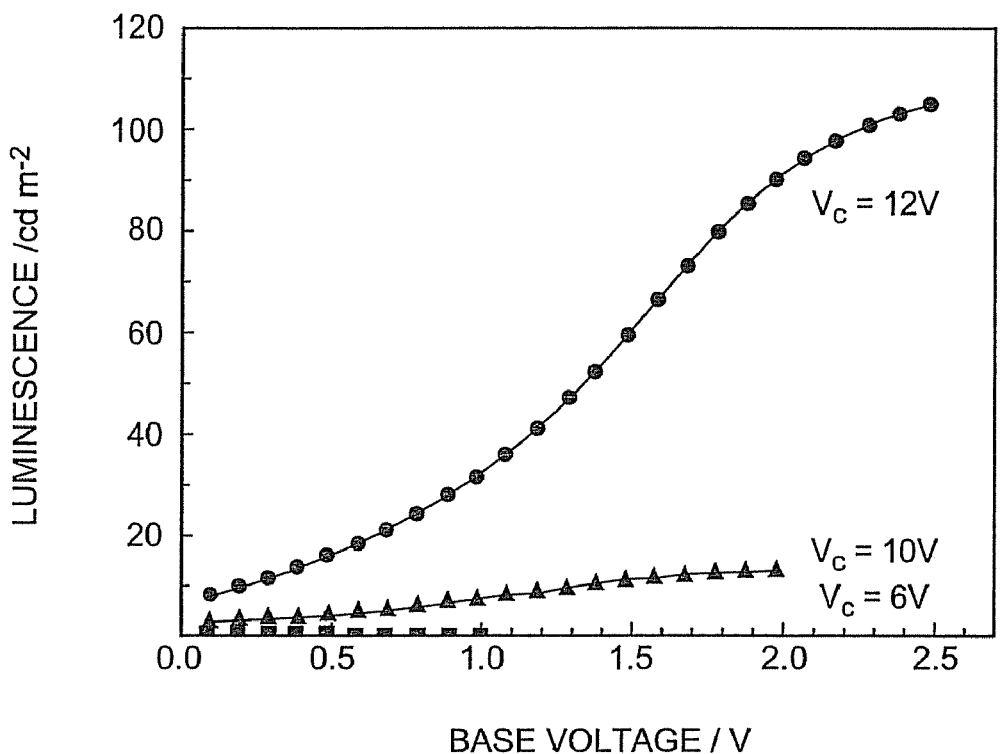
FIG. 18 is a graph showing the change of EL luminance with base voltage Vb, obtained using a light-emitting device having the structure shown in FIG. 16 to which a certain collector voltage Vc is applied.

FIG. 18 is a graph showing the change of EL luminance with base voltage Vb, obtained using the light-emitting device having the structure shown in FIG. 16 to which a constant collector voltage Vc was applied. As shown in FIG. 18, although the voltage exerted to the organic EL layer decreases due to the base voltage Vb applied, the EL luminance increases and reaches about 100 cd/m² at low voltages Vc and Vb of 12 V and 2.5 V, respectively.

The light-emitting device of the present invention comprises the organic EL layer 41 between the first semiconductor layer 5A and the collector electrode 2 of the transistor, as described above, and forms a two-dimensional layered structure, as a whole, so that it can attain two-dimensional current modulation. The light-emitting device having such a structure has the following advantages: the transistor that serves as a driving element and the organic EL device can be made at one time, and, moreover, since the area of occupation of the driving transistor is substantially zero, the rate of openings can be made higher. In recent years, luminescence has come to be observed even on organic FET structures. However, organic FET structures are still poor in performance, and presently known as practical are organic light-emitting transistors using vertical organic SITs. Only by forming an organic EL layer on the collector electrode 2 side, there can be realized the light-emitting device of the present invention capable of attaining current modulation. Moreover, the light-emitting device of the present invention is highly practical because it is not necessary to employ a micro-patterning process to make the intermediate electrode, etc.

The organic EL layer 41 comprises at least one luminescent layer 42 as mentioned above, and, preferably, further comprises one, or two or more layers selected from a hole injection layer 44, a hole transporting layer 43, an electron transporting layer, and an electron injection layer. In the examples shown in FIGS. 16 and 17, a hole transporting layer 43 and a hole injection layer 44 are situated on the collector electrode 2 side of the luminescent layer 42. Further, an exciton-blocking layer 45 is situated on the base electrode 4 side of the luminescent layer 42. In the light-emitting devices 40, 50, a larger amount of electric charges are accelerated by the transistor and arrive at the luminescent layer 42 in the organic EL layer 41, so that the charges can be easily injected from the base electrode 4. The organic EL layer 41 therefore has the advantage that it not always needs to contain a charge injection layer. The light-emitting devices 40, 50 thus have the advantage that, unlike conventional light-transmitting devices, they do not need to use, as the cathode, an alkaline metal, to which electrons can be easily injected, but which readily undergoes oxidation.

Any one of the materials that are usually used for the luminescent layers of organic EL devices can be used to form the luminescent layer 42 without limitation. Examples of such materials include luminescent pigments, luminescent metal complexes, and luminescent polymers.

Examples of luminescent pigments useful herein include cyclopentadiene derivatives, tetraphenyl butadiene derivatives, triphenylamine derivatives, oxadiazole derivatives, pyrazoloquinoline derivatives, distyrylbenzene derivatives, distyrylarylene derivatives, silole derivatives, thiophene cyclic compounds, pyridine cyclic compounds, perinone derivatives, perylene derivatives, oligothiophene derivatives, trifumanylamine derivatives, oxadiazole dimers, and pyrazoline dimers.

Examples of luminescent metal complexes useful herein include metal complexes having, as a central metal, a metal such as Al, Zn or Be, or a rare earth metal such as Tb, Eu or Dy, and, as a ligand, oxadiazole, thiadiazole, phenylpyridine, phenylbenzimidazole or quinoline structure. Specific examples of such metal complexes include alumiquinolinol complexes, benzoquinolinol-beryllium complexes, benzoxazole-zinc complexes, benzothiazole-zinc complexes, azomethyl zinc complexes, porphyrin-zinc complexes, and europium complexes.

Examples of luminescent polymers useful herein include polyparaphenylene vinylene derivatives, polythiophene derivatives, polyparaphenylene derivatives, polysilane derivatives, polyacetylene derivatives, polyvinyl carbazole, polyfluorenone derivatives, polyfluorene derivatives and polyquinoxaline derivatives, and copolymers of these derivatives.

Additives such as a dopant may be added to the luminescent layer 42 for the purpose of improving emission efficiency or of changing emission wavelength. Examples of dopants useful herein include perylene derivatives, coumarin derivatives, rubrene derivatives, quinacridone derivatives, squaleum derivatives, porphyrin derivatives, styryl pigments, tetracene derivatives, pyrazoline derivatives, decacyclene, phenoxazine, quinoxaline derivatives, carbazole derivatives, and fluorene derivatives.

Examples of materials useful for forming the hole transporting layer 43 include conventional hole transporting materials such as phthalocyanine, naphthalocyanine, porphyrin, oxadiazole, triphenylamine, triazole, imidazole, imidazolone, pyrazoline, tetrahydroimidazole, hydrazone, stilbene, pentacene, polythiophene and butadiene, and derivatives of these compounds. To form the hole transporting layer 43, it is also possible to use commercially available materials such as poly(3,4)ethylenedioxythiophene/polystyrene sulfonate (abbreviation: PEDOT/PSS, manufactured by BAYER AG., trade name: Baytron P AI4083, sold as an aqueous solution). Using a hole-transporting-layer-forming coating liquid containing any of the above compounds, the hole transporting layer 43 is formed. The hole transporting material may be incorporated either in the luminescent layer 42 or in the hole injection layer 44.

Furthermore, since the Me-PTC film serving as the first semiconductor layer 5A is an electron transporting layer, an electron transporting layer is not formed separately from the Me-PTC film in the light-emitting devices shown in FIGS. 16 and 17. If necessary, however, an electron transporting layer may be formed on the base electrode 4 side of the luminescent layer 42. Examples of materials useful for forming the electron transporting layer useful herein include conventional electron transporting materials such as anthraquinodimethane, fluorenylidene methane, tetracyanoethylene, fluorenone, diphenoquinone oxadiazole, anthrone, thiopyrane dioxide, diphenoquinone, benzoquinone, maronononitrile, dinitrobenzene, nitroanthraquinone, maleic anhydride, and perylene tetracarboxylic acid, and derivatives of these compounds. An electron-transporting-layer-forming coating liquid containing any of the above compounds is used to form the electron transporting layer. The electron transporting material may be incorporated either in the luminescent layer 42 or in the electron injection layer.

Examples of materials useful for forming the hole injection layer 44 include the compounds enumerated above as examples of the luminescent material for the luminescent layer 42, as well as phenylamines, starburst amines, phthalocyanines, oxides such as vanadium oxide, molybdenum oxide, ruthenium oxide and aluminum oxide, and derivatives of amorphous carbon, polyaniline, polythiophene, etc.

Although not included in the light-emitting devices shown in FIGS. 16 and 17, an electron injection layer may be formed, if necessary. Examples of materials useful for forming the electron injection layer include the compounds enumerated above as examples of the luminescent material for the luminescent layer, as well as alkaline metals, halides of alkaline metals, organic complexes containing alkaline metals, and so on, such as aluminum, lithium fluoride, strontium, magnesium oxide, magnesium fluoride, strontium fluoride, calcium fluoride, barium fluoride, aluminum oxide, strontium oxide, calcium, polymethyl methacrylate polystyrene sodium sulfonate, lithium, cesium and cesium fluoride.

A luminescent material or a charge transporting or injection material in the form of an oligomer or dendrimer may be incorporated in the above-described organic layers such as the luminescent layer and the charge transporting layer, as needed.

To form the above-described layers is used a vacuum deposition process. Alternatively, a coating liquid prepared by dissolving or dispersing the material for forming each layer in such a solvent as toluene, chloroform, dichloromethane, tetrahydrofuran or dioxane is applied with an applicator or the like, or is printed, to form each layer.

The exciton-blocking layer 45 acts as a hole- or electron-blocking layer and it is formed in order to prevent penetration of carriers (holes, electrons) to recombine them efficiently. In FIGS. 16 and 17, since the transistor is made up of n-type semiconductor materials, the collector electrode 2 acts as the anode. Consequently, holes are injected from the collector electrode 2, so that it is preferable to form, as a hole-blocking layer, the exciton-blocking layer 45 on the base-electrode 4-side surface of the luminescent layer 42. In the light-emitting devices shown in FIGS. 16 and 17, BCP (1-bromo-3-chloropropane) was used to form the exciton-blocking layer 45.

The exciton-blocking layer 45 formed using BCP, shown in FIGS. 16 and 17, has almost the same LUMO as Me-PTC in the energy diagram, so that it does not block electrons flowing from the Me-PTC film. However, it has higher HOMO than $Alq_3$, so that it blocks holes from the $Alq_3$ film. BCP in an excited state is higher in energy level than $Alq_3$ in an excited state. Therefore, excitons that have occurred in the $Alq_3$ film are not diffused into the BCP film.

If the transistor is made up of p-type semiconductor materials, the collector electrode 2 acts as the cathode. Consequently, electrons are injected from the collector electrode 2, so that it is preferable to form, as an electron-blocking layer, the exciton-blocking layer 45 on the base-electrode 4-side surface of the luminescent layer 42.

(Co-Planar Device)

Next, a co-planar device using the transistor of the invention as a driving transistor for an organic EL device will be described. In a flexible display using an organic EL device, it is necessary to make an active matrix circuit using an organic transistor. Co-planar devices using organic FETs and organic EL devices in combination have been reported. However, since organic FETs are difficult to allow large currents to flow, they have required large comb-shaped electrodes to cause high voltages of several tens volts and to allow large currents to flow. Since the above-described transistor of the present invention can attain large current modulation at low voltages, it is suitable as a driving transistor for an organic EL device.

Figure 19:
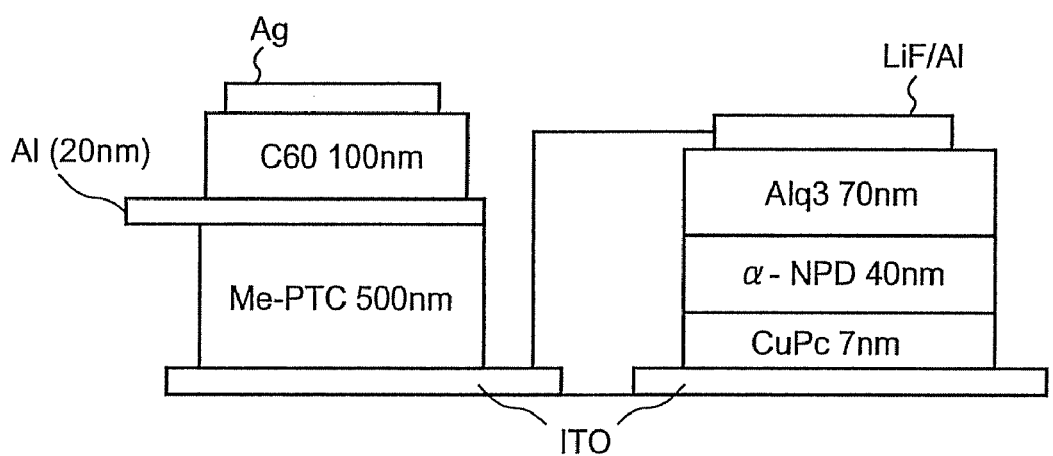
FIG. 19 is a schematic cross-sectional view of a switching structure for an organic EL device using a transistor of the present invention.

FIG. 19 is a schematic cross-sectional view of the switching structure for an organic EL device, using a transistor of the present invention. This co-planar device was made in the following manner: a transistor made by depositing Me-PTC film (thickness 500 nm) as the first semiconductor layer 5A, aluminum film (thickness 20 nm) as the base electrode 4, $C_{60}$ film (thickness 100 nm) as the second semiconductor layer 5B, and silver film (thickness 30 nm) as the emitter electrode 3 in the order named, and an organic EL device were juxtaposed to each other on one ITO electrode glass substrate, and were connected to each other by vacuum-depositing LiF (thickness 0.5 nm)/Al (thickness 100 nm) as the cathode for the organic EL in such a fashion that it overlapped the collector electrode 2 of the transistor. The organic EL device was made by depositing CuPc film with a thickness of 7 nm as the hole injection layer 44, NPD film with a thickness of 40 nm as the hole transporting layer 43, and Alq$_3$ film with a thickness of 70 nm as the luminescent layer 42 on the ITO electrode glass substrate in the order named.

Figure 20:
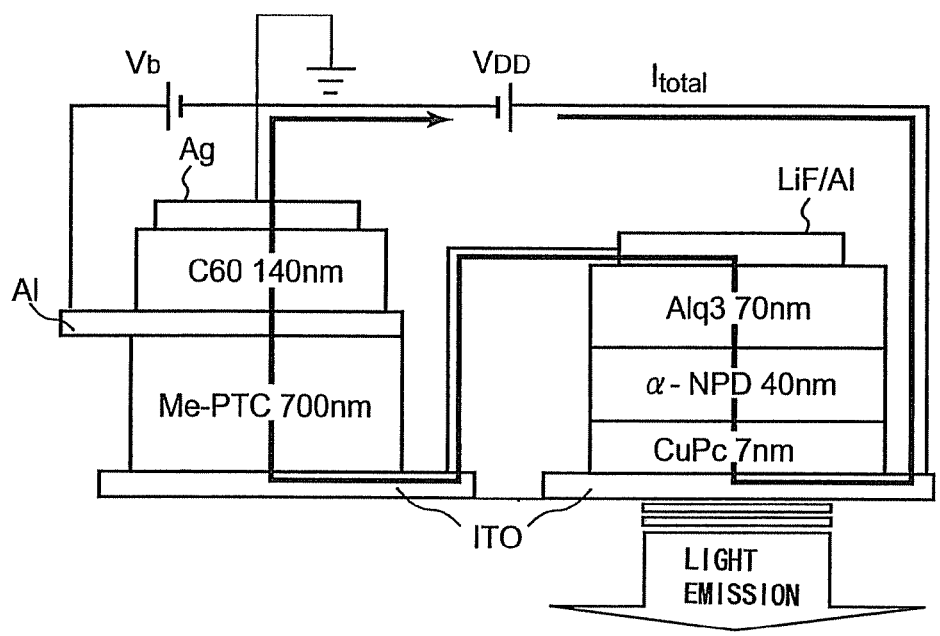
FIG. 20 is a schematic view showing the current path in a co-planar device to which a base voltage Vb is applied while applying a total voltage VDD.
Figure 21:
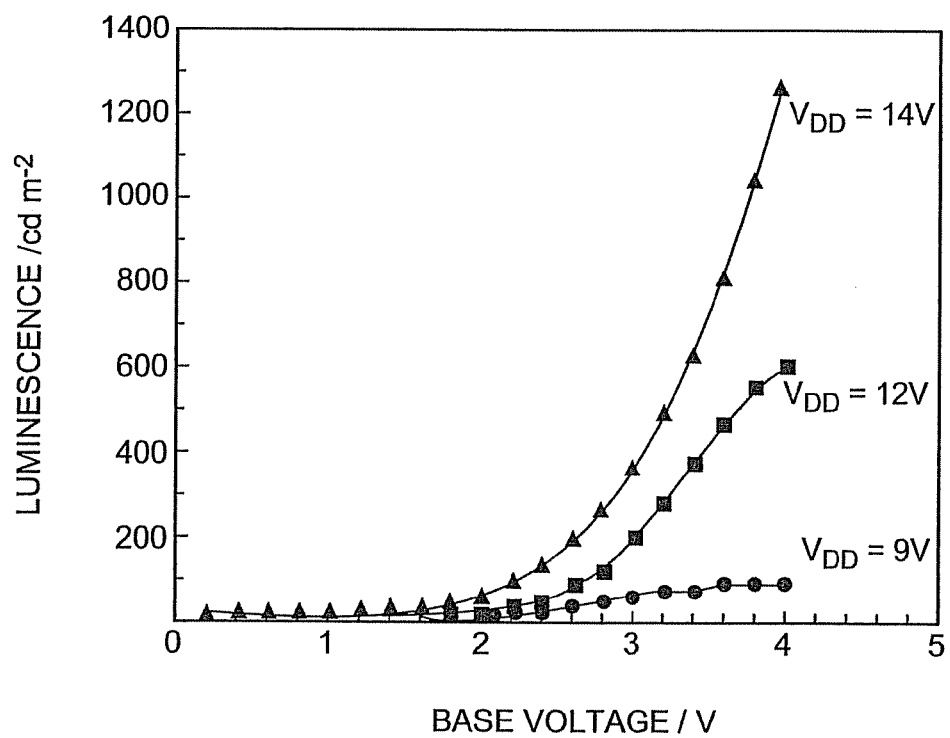
FIG. 21 is a graph showing the luminance modulation characteristics of the co-planar series device shown in FIG. 19.

FIG. 20 is a schematic view showing the current path when a base voltage Vb is applied while applying a total voltage VDD to the co-planar device. FIG. 21 is a graph showing the luminance modulation characteristics of the co-planar series device shown in FIG. 19, which were evaluated by measuring, with a luminance meter, the intensity of light emitting from the organic EL device when a base voltage Vb was applied while applying a total voltage VDD.

When a total voltage VDD of 14 V was applied, a modulated luminance of above 1200 cd/m$^2$ was obtained at a control voltage of as low as 4 V, as shown in FIG. 21. Further, at a total voltage VDD of 12 V, luminescence was suppressed to such a degree that it was not visually confirmed when no base voltage Vb was applied, so that the perfect ON and OFF states were attained. These voltages are much lower than those in the conventional devices composed of organic FETs and organic EL devices. This fact shows that significantly lower voltages are realized by the use of the transistor of the invention.

The transistor of the present invention proved to be excellent in performance as a driving transistor for an organic EL device because of its property of modulating a large current at lower voltages, as mentioned above. That the transistor can attain large current modulation means that it is possible to make the area of occupation of the transistor in one pixel smaller, which leads to improvement of the rate of openings in a display. Also from this point of view, the transistor of the present invention can be expected as a driving transistor for a flexible display.

As described above, the light-emitting device of the present invention can attain large current surface emission because of the organic EL layer situated between the base electrode and the collector electrode. Further, unlike conventional SIT structures, the light-emitting device does not require a micro-patterning process to make the base electrode. Furthermore, the light-emitting device can attain large current modulation at low voltages and can have an increased ON/OFF ratio. The light-emitting device of the present invention therefore is simple in structure and is practical.

(Display)

A display of the present invention comprises a substrate and the above-described light-emitting device of the invention formed on the substrate, and is of high luminance. Various materials useful for the substrate of the transistor of the invention, mentioned in the above description of the first transistor, can be used for the substrate of the display. Examples of flexible substrates useful herein include flexible substrates made from glass, silica, polyethylene, polypropylene, polyethylene terephthalate, polymethacrylate, polymethyl methacrylate, polymethyl acrylate, polyesters and polycarbonate. The substrate may be either in sheet form or in continuous form, and specifically, in the form of a card, a film, a disc, a chip, or the like.

The invention claimed is:

1. A transistor comprising:
   an emitter electrode,
   a collector electrode, and
   a semiconductor layer and a sheet base electrode between the emitter electrode and the collector electrode,
   wherein the base electrode has a high surface roughness on its surface.

2. The transistor according to claim 1, wherein the semiconductor layer is composed of a first semiconductor layer situated between the collector electrode and the base electrode, and a second semiconductor layer situated between the emitter electrode and the base electrode.

3. The transistor according to claim 1, wherein the base electrode has a thickness of 80 nm or less.

4. The transistor according to claim 2, wherein the semiconductor layer situated between the collector electrode and the base electrode is a crystalline semiconductor layer.

5. The transistor according to claim 4, wherein the crystals making up the semiconductor layer have diameters that are nearly equal to or greater than the thickness of the base electrode and that are great enough to cause the high surface roughness on the surface of the base electrode.

6. The transistor according to claim 1, wherein the base electrode is a film of a metal and its one or each surface is covered with a film of an oxide of the metal.

7. The transistor according to claim 2, wherein the first semiconductor layer situated between the collector electrode and the base electrode and the second semiconductor layer situated between the emitter electrode and the base electrode are layers of different semiconductor materials.

8. The transistor according to claim 7, wherein the first semiconductor layer and the second semiconductor layer are hole or electron transporting material layers.

9. A transistor comprising:
   an emitter electrode,
   a collector electrode, and
   a semiconductor layer and a sheet base electrode between the emitter electrode and the collector electrode,
   wherein the semiconductor layer is composed of a first semiconductor layer situated between the collector electrode and the base electrode, and a second semiconductor layer situated between the emitter electrode and the base electrode, and
   wherein the first semiconductor layer situated between the collector electrode and the base electrode and the second semiconductor layer situated between the emitter electrode and the base electrode are organic compound layers.

10. The transistor according to claim 1, wherein the thickness T1 of the first semiconductor layer situated between the collector electrode and the base electrode and the thickness T2 of the second semiconductor layer situated between the emitter electrode and the base electrode are in a ratio (T1/T2) ranging from 1/1 to 10/1.

11. The transistor according to claim 1, further comprising a charge injection layer between the emitter electrode and the semiconductor layer adjacent to the emitter electrode.

12. The transistor according to claim 11, wherein the charge injection layer includes an alkaline metal, such as LiF or Ca, or a compound thereof.

* * * * *